United States Patent [19]
Ujazdowski et al.

[11] Patent Number: 6,034,978
[45] Date of Patent: Mar. 7, 2000

[54] GAS DISCHARGE LASER WITH GAS TEMPERATURE CONTROL

[75] Inventors: Richard C. Ujazdowski, San Diego; Robert A. Shannon, El Cajon; Dmitry Berger, San Diego; William N. Partlo, Poway; Tom A. Watson, Carlsbad; Paul S. Thompson, San Diego; Toshihiko Ishihara, San Diego; Carl E. Tedesco, II, Del Mar; Donald G. Larson, San Diego; Steven M. Harrington, Cardiff; Richard G. Morton, San Diego; James H. Azzola, San Diego; I. Roger Oliver, San Diego; Thomas P. Duffey, San Diego; Igor V. Fomenkov, San Diego, all of Calif.

[73] Assignee: Cymer, Inc., San Diego, Calif.

[21] Appl. No.: 09/310,872

[22] Filed: May 12, 1999

[51] Int. Cl.⁷ ........................................................ H01S 3/04
[52] U.S. Cl. .................. 372/34; 372/59; 372/57
[58] Field of Search .................. 372/34, 57, 59, 372/58

[56] References Cited

U.S. PATENT DOCUMENTS 5,377,215  12/1994  Das et al. ................................... 372/57
5,748,656   5/1998  Watson et al. ............................. 372/35

FOREIGN PATENT DOCUMENTS 2-22784  1/1990  Japan .

Primary Examiner—Leon Scott, Jr.
Attorney, Agent, or Firm—John R. Ross, Esq.

[57]  ABSTRACT

A gas discharge laser with fast response gas temperature control to maintain laser gas temperature within desired limits during burst mode operation. Preferred embodiments include a passive temperature stabilizer having fins with surface areas exposed to flowing laser gas at least equal to the surface area of the cooling fins of a laser gas heat exchanger. Preferred embodiments utilize heating elements and coolant flow control to regulate laser gas temperatures using processors programmed to anticipate idle periods.

28 Claims, 23 Drawing Sheets

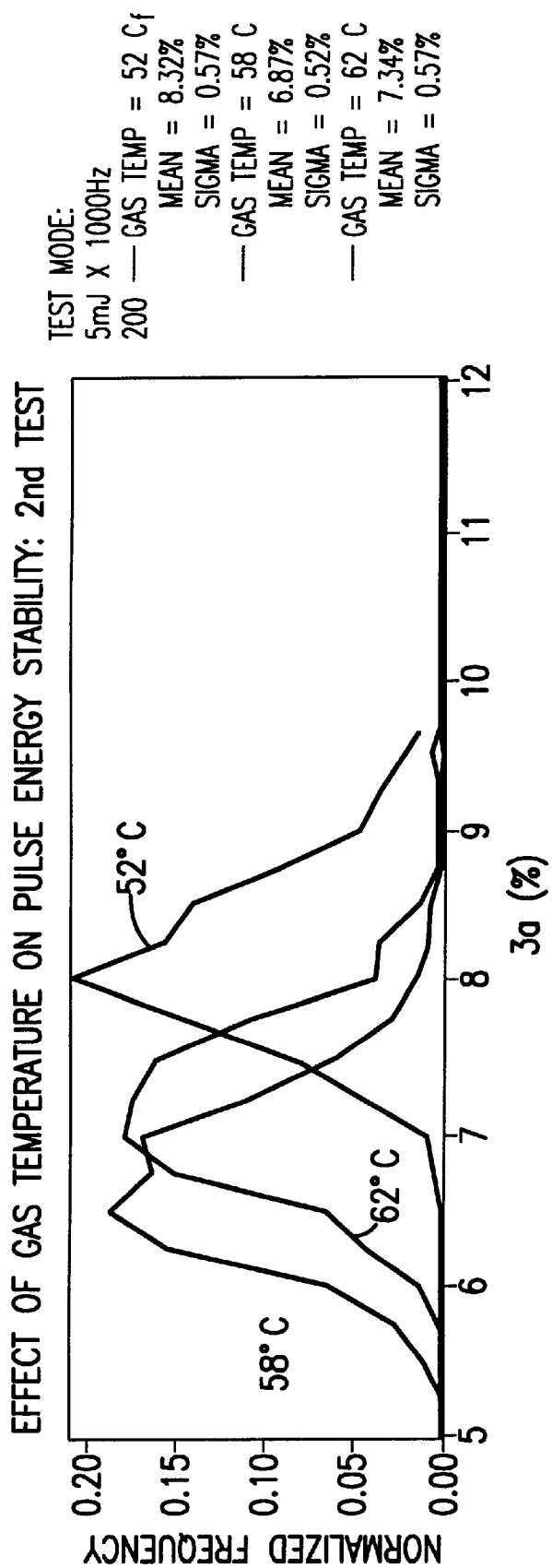

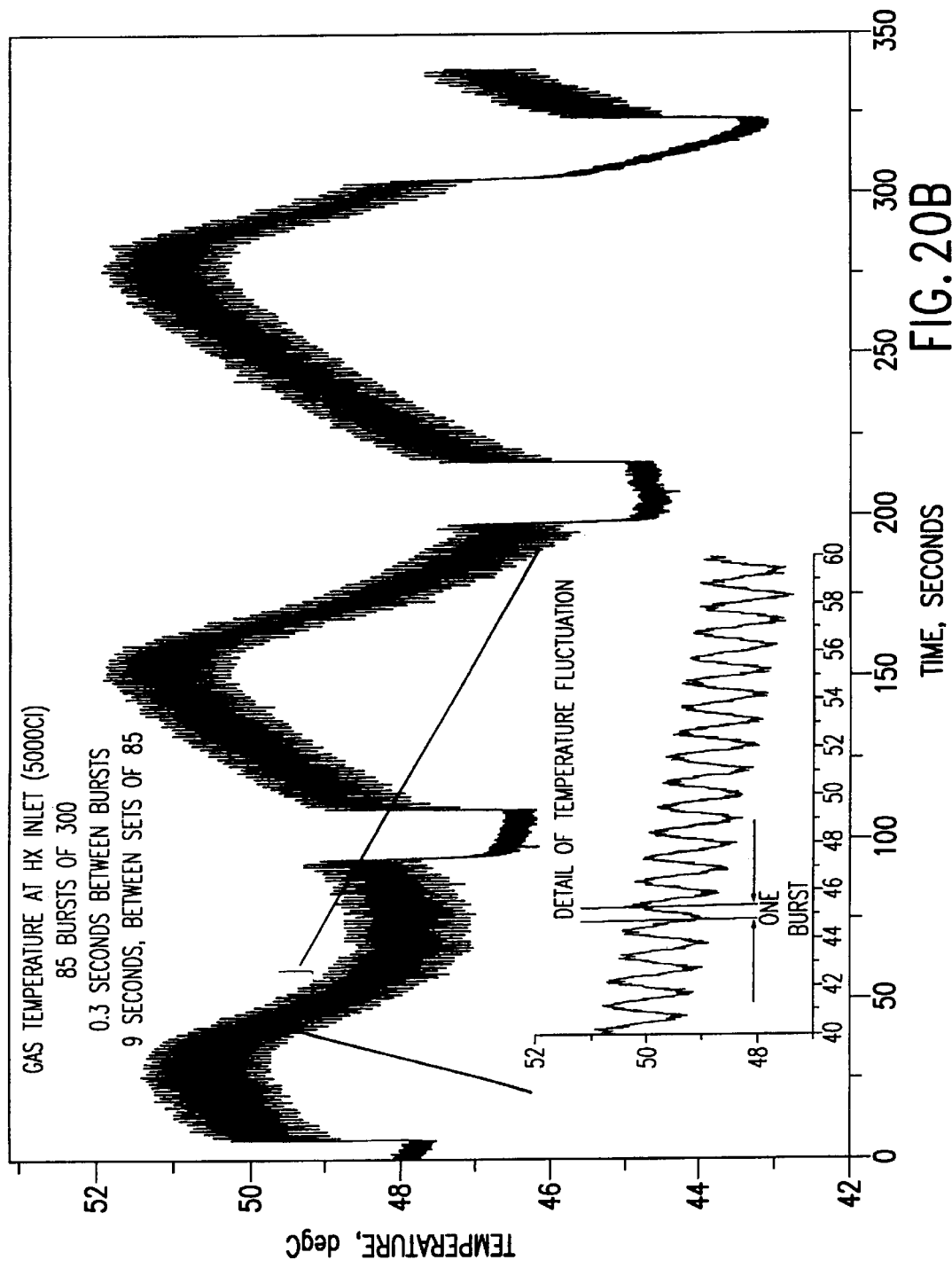

6,034,978

GAS DISCHARGE LASER WITH GAS TEMPERATURE CONTROL

This invention relates to temperature control equipment and techniques for high pulse rate gas discharge lasers and in particular to equipment and techniques for controlling the temperature of gas circulating in such lasers used to illuminate stepper or scanner devices.

BACKGROUND OF THE INVENTION

In typical gas discharge lasers such as the excimer laser described in U.S. Pat. Nos. 5,377,215 and 5,748,656 two electrodes are disposed in a spaced apart relationship in a chamber and a gas is circulated between the electrodes. FIG. 1 is a cross section drawing of a prior art KrF excimer laser as shown in U.S. Pat. No. 5,377,215. When a high voltage pulse is applied between the electrodes, 18 and 20 in FIG. 1, an electrical discharge is created which produces a laser pulse. In prior art commercial excimer lasers pulses may be produced at rates in the range of 100 Hz to 2000 Hz to produce a pulsed laser beam. The optical energy in a typical pulse of a commercial KrF excimer laser used in integrated circuit lithography is about 10 mJ and the electrical energy utilized to produce it is somewhat more than 2J most of which heats laser gas circulating in the laser chamber. So if the laser is operating continuously at pulse rate of 1000 Hz, the discharges are dumping about 2,000 watts of energy into laser chamber 10. Only about 0.5 percent of the input energy comes out as the laser pulse. The laser gas, which in this case is a mixture of about 0.1% fluorine, 1% krypton and the rest neon, is circulated between the electrodes at a speed of about 2000 cm per second by 3.25 inch tangential blower fan 50 operating at about 3300 rpm. This fast circulation of the laser gas by the fan adds heat to the chamber at the rate of about 500 watts. Performance of the laser is known to be affected by gas temperature and it is known to experiment with lasers to determine a temperature which results in optimum performance. Preferred operating temperatures of a typical prior art KrF excimer laser is in the range of about 50° C.

In order to operate at a desired temperature such as 50° C., some prior art lasers utilize heating elements which may be mounted on or in the chamber wall to help initially increase the temperature to the desired range and to increase the chamber temperature if the temperature falls below a desired range. Cooling in prior art lasers is typically provided by a finned water cooled heat exchanger, such as 66 as shown in FIG. 1, disposed inside the chamber. In some cases additional cooling is provided by water cooled cold plate mounted on the outside of the chamber walls. Cooling systems must on average remove heat from the chamber at the same rate it is added to the chamber in order to maintain a constant average temperature.

A preferred operating mode for an excimer laser used as a light source in stepper and scanner equipment for integrated circuit production is called a "burst mode". In this mode the laser is operated in "bursts" such as about 300 pulses at a pulse rate of 1000 Hz, each 300 pulse burst illuminates a single exposure site of about 2 or 4 square centimeters on a wafer which may be about 8 inches in diameter. There are typically many (such as about 85) exposure sites on a single wafer each site corresponding to one or more integrated circuits. Each burst is separated by an idle period, for example, of 0.3 seconds. After, for example, 85 "bursts" covering 85 exposure sites, the laser may be idle for a longer period of, for example, about 9 seconds while a new wafer is moved into position by the stepper or scanner.

FIG. 2 is a modified version of FIG. 3 from U.S. Pat. No. 5,748,656 (with most of the designation numbers omitted) and it shows a prior art system for controlling temperature. The system comprises a temperature detector 330 extending into the chamber to measure gas temperature. The signal from detector is utilized by a microprocessor based controller in a feedback loop to control water flow to cooling finned heat exchanger 66 and rod type heating elements 67 in order to maintain the gas temperature within a desired operating range. That patent teaches that the processors can be programmed to cause a heating element to add heat equivalent to the heat which would have been added by discharge pulses during short idle times so that approximately constant gas temperatures can be maintained. With the heater controlled by the microprocessor, heat could be added whenever the laser is not operating continuously (such as during the above 0.3 second down time) or, more practically, in between separate series of bursts (such as the above 9 second idle period).

Adding heat energy with a heating element equivalent to about 1000 watts during the 9 second idle period provides substantially constant heat input and heat extraction without varying the cooling water flow. Alternatively, some prior art systems vary the cooling water flow based on a temperature feedback arrangement in order to maintain gas temperature within an operating range. A problem with these approaches is that whereas heat is added to the laser gas instantaneously by the electrodes, several seconds or minutes may be required for heat to be transferred from a heating element to the laser gas. Several seconds or minutes may also be required for changes in water flow to be effective. Therefore, temperature fluctuations (even oscillations) of a few degrees C. about a desired temperature generally result from the normal burst mode operation in prior art gas discharge lasers. These temperature fluctuations can adversely affect performance.

What is needed are improvements which will permit better temperature control of electric discharge gas lasers.

SUMMARY OF THE INVENTION

The present invention provides a gas discharge laser with fast response gas temperature control to maintain laser gas temperature within desired limits during burst mode operation. Preferred embodiments include a passive temperature stabilizer having fins with surface areas exposed to flowing laser gas at least equal to the surface area of the cooling fins of a laser gas heat exchanger. Preferred embodiments utilize heating elements and coolant flow control to regulate laser gas temperatures using processors programmed to anticipate idle periods.

BRIEF DESCRIPTION OF THE DRAWINGS

FIGS. 19A, 19B and 19C show the effect of temperature on laser performance.

FIGS. 20A, 20B and 20C show prior art test data using a temperature sensor having a response time of about 0.26 seconds.

DETAILED DESCRIPTION OF PREFERRED EMBODIMENTS

Preferred embodiments of the present invention can be described by reference to the drawings.

Importance of Gas Temperature Control

Figure 19B:
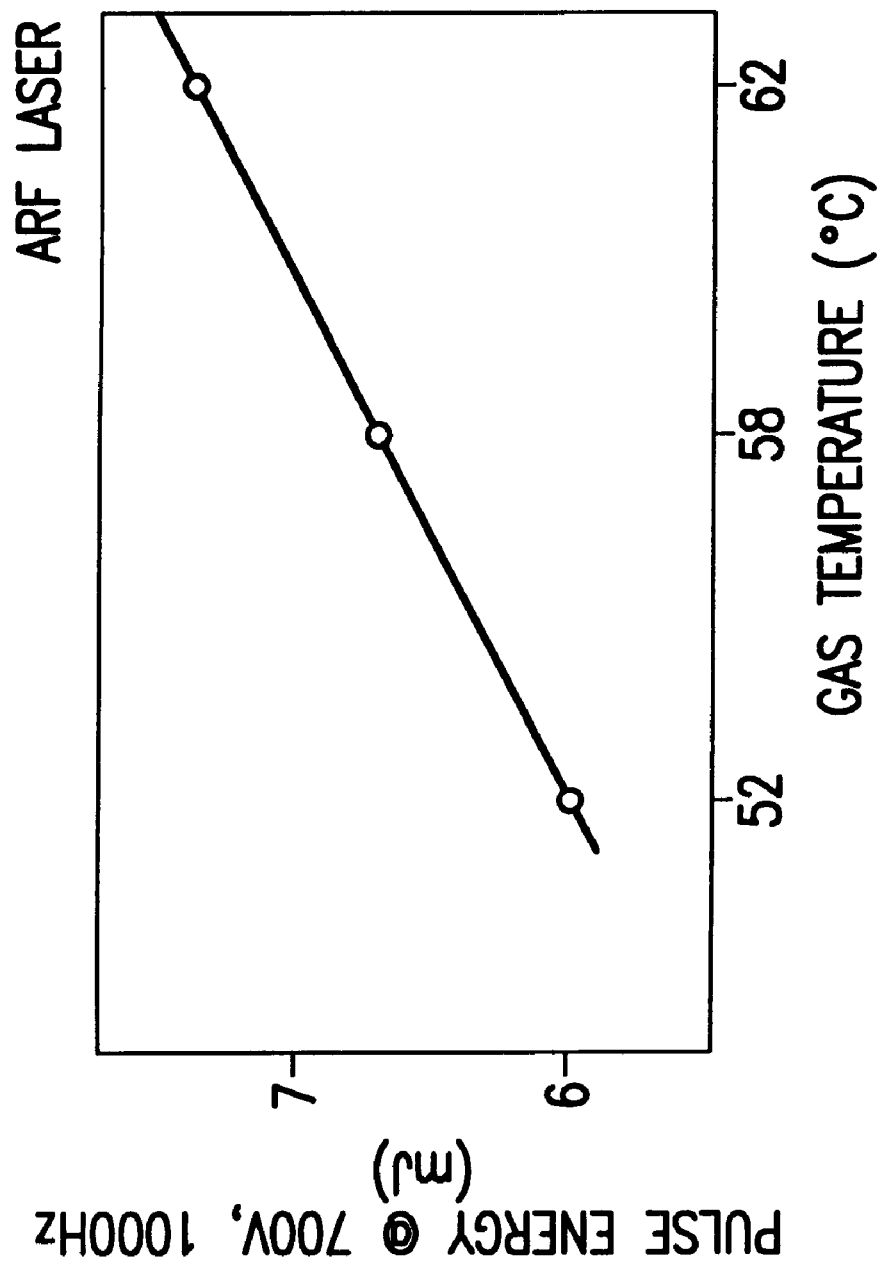
Figure 19C:
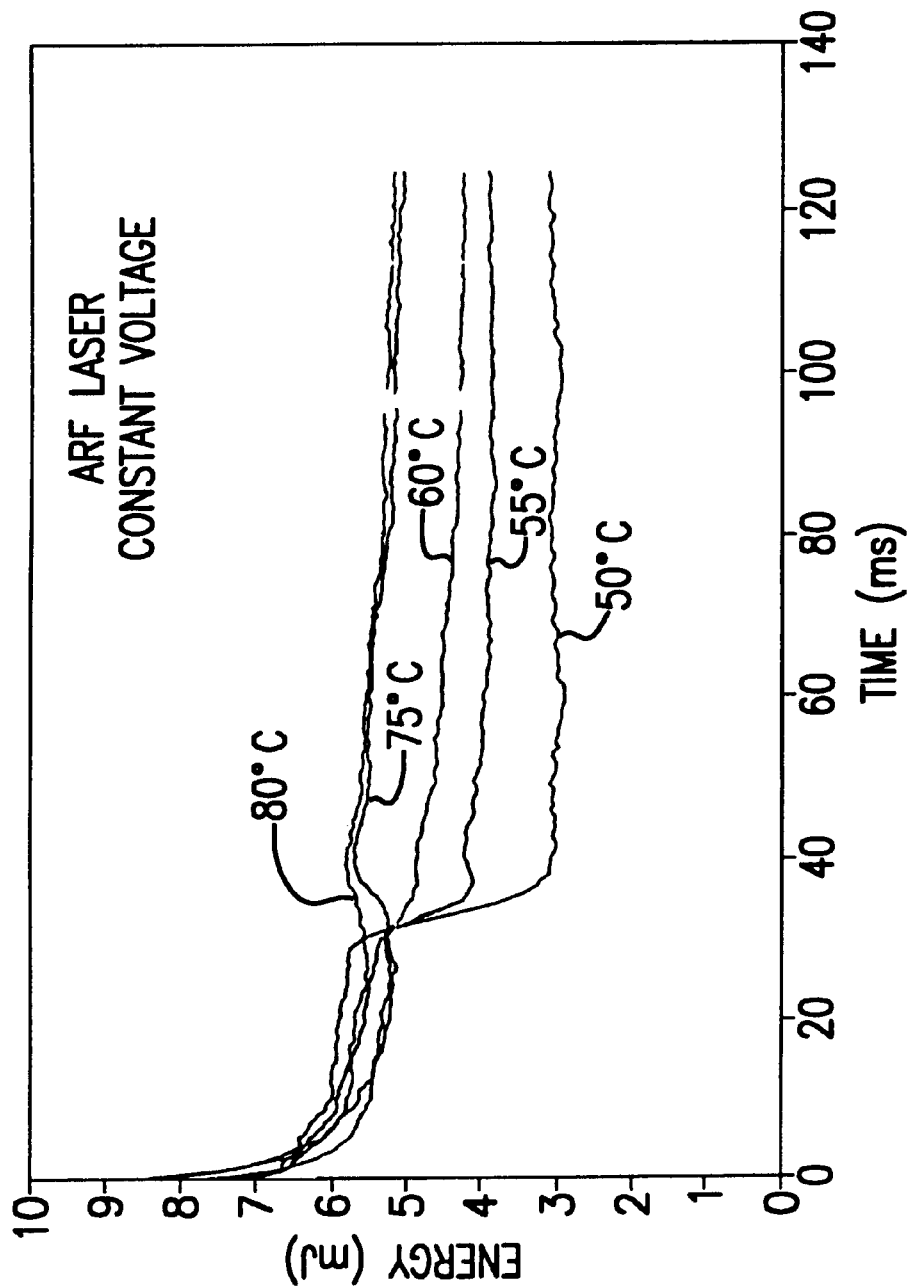

Applicants have discovered that for some electric discharge gas lasers, maintaining gas temperature within a desired range can greatly improve laser performance. For example, Applicants have found that temperature variations of up to 5 to 7° C. in KrF excimer lasers in the range of about 45° C. to 75° C. have only a minor impact on laser beam parameters. These impacts are so small they are difficult to measure. However, temperature variation of a few degrees in ArF excimer lasers can have a substantial effect on laser performance. For example, the graphs in FIG. 19C show pulse energy for 100 pulses of 100-pulse 1000-Hz bursts at 5 different initial gas temperatures with constant discharge voltage. This graph demonstrates the very major effects gas temperature can have on pulse energy stability for an ArF laser. This data indicates that the preferred temperature for best energy stability for this particular laser is about 65° C. (for pulse energy output uniformity within a burst). FIG. 19B shows a plot of pulse energy as a function of gas temperature at continuous 1000 Hz operation. FIG. 19A shows energy stability curves for an ArF laser at 52° C., 58° C. and 62° C. For pulse-to-pulse energy stability, the optimum gas temperature is about 60° C.

Energy Balances

The total quantity of gas in a typical KrF lithography excimer laser is about 20 liters at about 3 atmospheres, about 97 to 99 percent of which is neon. The density of neon at 3 atm and 50° C. is about 2.5 gm/liter. Thus, the mass of gas in the laser is about 50 grams. The specific heat, Cv of neon at the above pressure and temperature is about 0.623 J/gm° C. Each pulse adds about 2 J to the gas in the chamber.

Continuous Operation

At continuous laser operation at one thousand pulses per second the electrodes dump about 2000 J per second into the chamber. The fan 50 adds heat at the rate of 500 J per second. At equilibrium heat must be removed at the same rate that it is added so at continuous operation heat must be removed at the rate of about 2.5 kilowatts. Most of the heat is removed by the finned water cooled heat exchanger 66. Some heat is removed through the chamber walls. At typical fan speeds for these types of lasers a volume of gas equal to the chamber volume is circulated between the electrodes in about 40 milliseconds corresponding to a gas speed of about 25 meters per second between the electrodes. (This corresponds to a gas flow of about 2.5 cm between laser pulses.) This is a sufficient flow to provide "clean" gas for each new pulse.

In order to estimate the temperature variations in the chamber we will assume the flowing laser gas is divided into 40 sub-volumes each comprising 1/40 of the total gas in the chamber which would be 0.5 liter or 1.25 grams. We will call each sub-volume a "0.5 liter slug". Thus, at equilibrium at 1000 pulses per second about 2J of energy is dumped into each 0.5 liter slug as it passes between the electrodes. This is enough energy to increase the temperature of the 0.5 liter slug by about 2.6° C.

$$\Delta T = 2 \text{ J}/(1.25 \text{ gm})(0.62 \text{ J/gm}°C.) = 2.58° \text{ C.}$$

Figure 3:
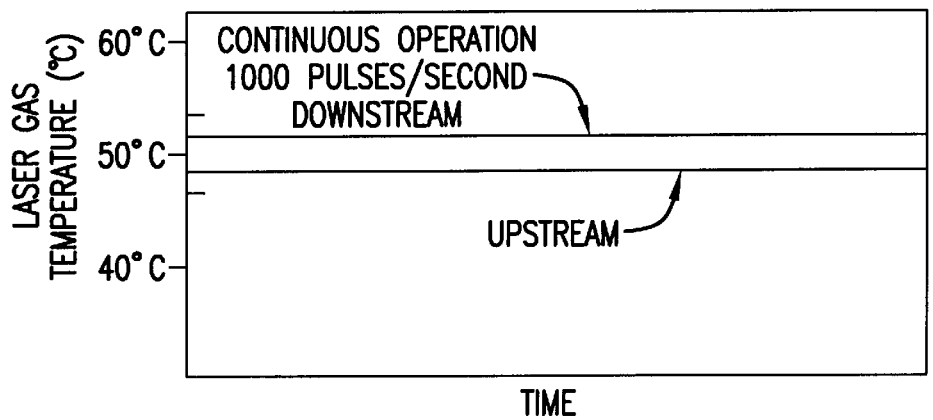
FIG. 3 shows laser temperature upstream and downstream of the electrodes at continuous operation.

At equilibrium that 2 J must be removed from the slug before it returns to the electrodes. Therefore, the temperature of the laser gas will be about 2.68° C. higher downstream of the electrodes than the upstream temperature. If the average chamber temperature is 50° C. then the upstream gas temperature will be about 48.7° C. and the downstream temperature will be about 51.3° C. At continuous operation at 1000 Hz, the upstream, downstream and average temperature of the gas in the chamber will be substantially constant on all time scales as indicated in FIG. 3.

Continuous Burst Mode Operation

The laser may be operated in a continuous burst mode and we can examine that mode even though it is not a normal mode of operation. An example of such a continuous burst mode would be bursts of 300 pulses at the rate of 1000 pulses per second for 0.3 seconds followed by 0.3 seconds of downtime. This produces a 50 percent duty factor. In such a mode of operation, the average temperature of the laser gas fluctuates substantially. Heat in this mode is being added (on a time scale of at least several seconds) by the electrodes at an average rate of 1000 J per second and by the fan at 500 J per second and thus heat at equilibrium is removed at a rate of 1500 J per second.

On a short time scale the temperature in the chamber and in particular the temperature seen by the electrodes at the time of discharge will vary substantially both during the 0.3 second that the electrode add about 600 J to the gas and during the 0.3 second downtime that the electrodes add substantially zero heat energy to the gas. During both of the 0.3 second intervals electrode heat is being removed at the rate of about 300 J per 0.3 second interval.

Figure 4:
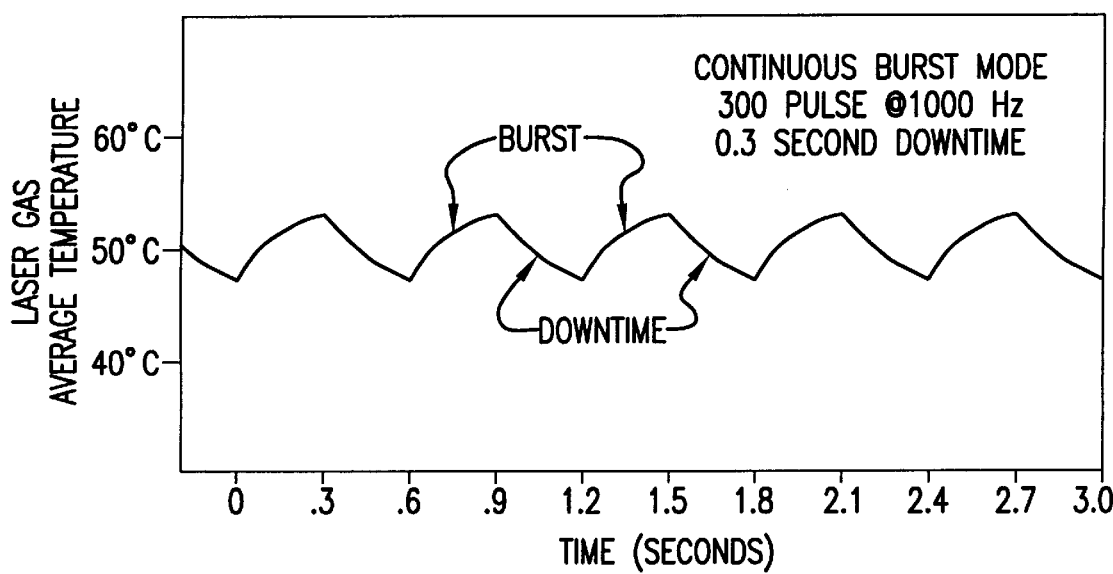
FIG. 4 shows average laser gas temperature swings on a few tenths of seconds time scale with a continuous burst mode of operation.

The resulting imbalances result in a swing in the average gas temperature of several degrees. A graph showing these swings is shown in FIG. 4.

Slug Effect

In a continuous burst mode operation, the several degree temperature increase seen by the electrodes during a burst of more than 40 milliseconds is not completely linear but the temperature increases in a step-like manner. For example, if the total temperature increase during a burst is 5° C. and the average gas temperature is 50° C. the gas approaching the electrodes for the first burst would be 44.6° C. The temperature of gas leaving the electrodes would be 47.2° C. Approaching temperature for the second pulse would also be about 44.6° C. since the heated gas from the first pulse is flowing away from the electrodes. There is no significant increase until the first 0.5 liter slug makes its loop around the laser chamber and returns for the 41st pulse. At that time, the electrode will see a temperature increase in a step to about 47° C. and after the step the incoming temperature will be relatively constant until about pulse 81. Pulses 81 through 120 will see another step increase in the entering temperature. Although the steps become less distinct, this effect continues until the end of the burst at pulse 300 at which time the average temperature has increased about 4° C. The average temperature then decreases to about 46° C., again in 40 millisecond steps, during the subsequent 0.3 second downtime. This effect is shown graphically in FIG. 4.

Burst Mode with Periodic Extended Downtime

We may make a similar estimate of the heat flow with the laser operating in a type of burst mode which exemplifies a normal operating mode for an excimer laser used with a stepper or scanner as the illumination source in an integrated circuit lithography process. This mode, discussed in the Background section consists of one-minute cycles of bursts of 300 pulses at 1000 pulses per second, each 0.3 second burst followed by a downtime of 0.3 seconds and after 85 bursts a 9 second downtime. This cycle is repeated continuously. This corresponds to a duty cycle of about 42.5 percent.

This operating mode corresponds to the 51 seconds needed to illuminate 85 illumination sites on a single wafer and the 9 seconds needed to change the wafer. The heat added to the chamber during each of these 60 second cycles by the electrodes is about 51,000 J (i.e., (2J/ pulse)(300 pulses/burst)(85 bursts)). The heat added by the blower during this 60 seconds cycle is about 30,000 J (i.e., (500 watts)(60 seconds)). Therefore, the total heat input averages about 81,000 J per 60-second cycle, equivalent to an average 1.35 KW. Heat removal from the chamber is assumed to be relatively constant at a rate equal to the heat added (i.e., about 1.35 KW), most of the heat being extracted by the water cooled finned heat exchanger 66. The temperature of the gas in prior art lasers is typically measured, as indicated in the Background section, by a temperature detector having a response time of a few seconds or longer. Therefore, these sensors can provide a good measurement of a time average gas temperature. This temperature measurement is used in a feedback loop to control cooling water flow to the finned heat exchanger. Prior art temperature detector 116 is not fast enough to accurately measure 0.3 second temperature swings shown in FIG. 4 or the step type temperatures associated with the slug effect discussed above and illustrated in FIG. 5.

The heat added by the blower is substantially constant, therefore, it does not contribute to short term (i.e., less than 1 minute) gas temperature fluctuations. The heat removed by the water cooled finned heat exchanger depends on the gas temperature and the cooling water flow and temperature. Assuming no change in water flow and only small changes in gas temperature the heat removed by the heat exchanger during a 60 second cycle will be approximately constant and not contribute substantially to temperature fluctuations. As the temperature fluctuations become large, the rate of heat extraction by the heat exchanger will vary, becoming relatively greater at higher temperatures and relatively smaller at lower temperatures. Also, as temperature fluctuations become large heat energy is transferred back and forth between the gas and the structural elements in the chamber and the chamber walls. Both of these effects will tend to damp the temperature fluctuations especially when the fluctuations tend to become larger.

Effect of Temperature Changes During Transients on Heat Flow

Figure 7:
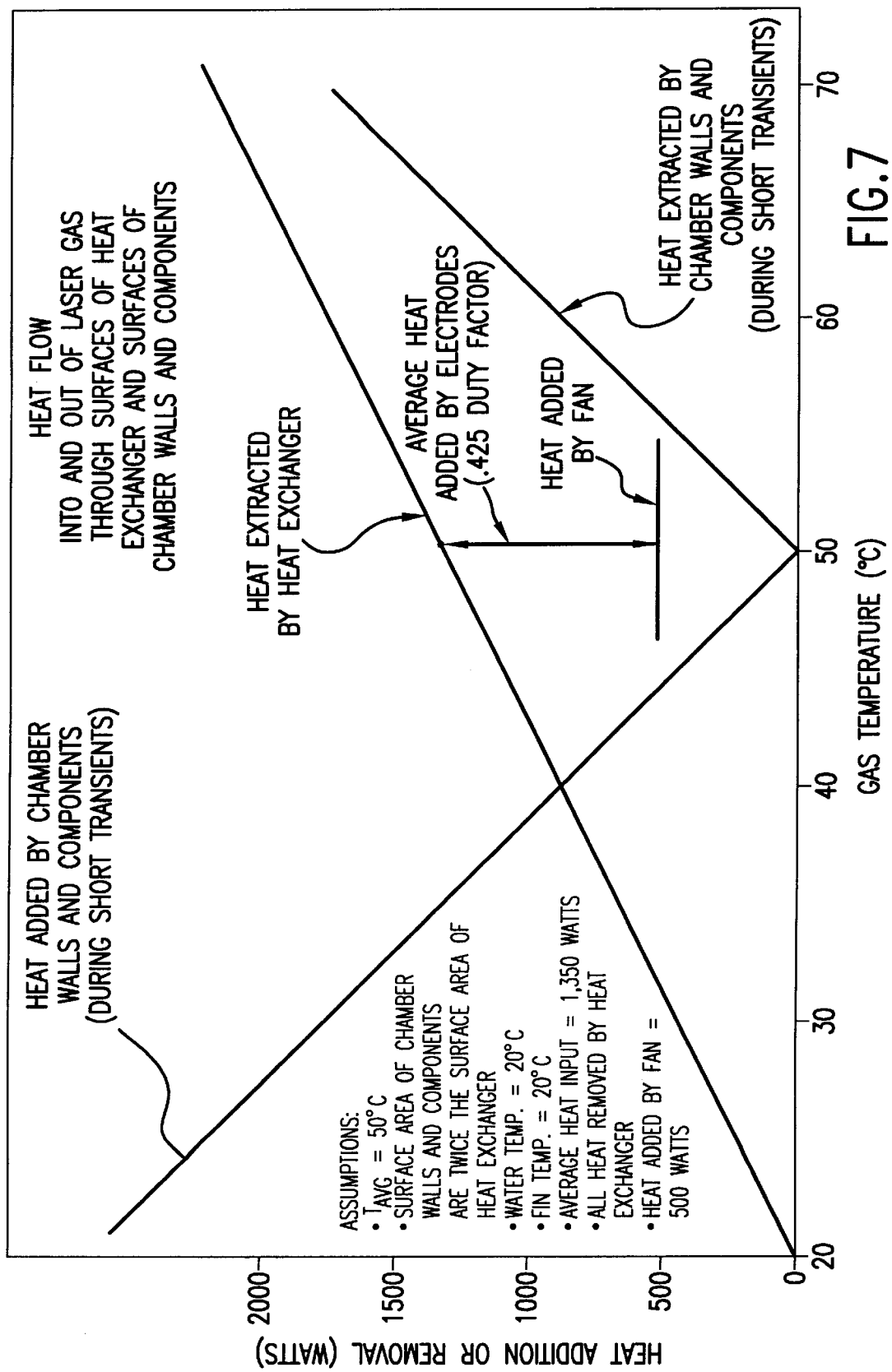
FIG. 7 is a chart giving simplified qualitative estimates of heat flow into and out of laser gas.

The surface area of the heat exchanger is about 0.8 m$^2$ and the surface area of the chamber walls and other components in contact with the flowing gas is about 1.6 m$^2$. The chamber walls and components are at a temperature approximately equal to the average gas temperature at the location of the particular wall section or component. These temperatures will be close to 50° C. when that is the average gas temperature. The surfaces of the heat exchanger are at a temperature approximately equal to the cooling water which we will assume to be 20° C. and there typically is a small increasing gradient extending outward on each fin. If we assume a linear relationships between heat flow and ΔT and surface area we can estimate rate of heat flow out of the gas into the heat exchanger and the rate of heat flow into and out of the chamber walls and components as the temperature of the gas changes during short term transients of less than a few seconds. During such transients, the surface temperatures of walls and metal components will not change appreciably due to their large thermal masses and the heat flow into and out of the walls and the components will be approximately proportional to the change in the gas temperature from the average gas temperature at those locations. FIG. 7 is a very rough simplified description of this effect assuming burst mode, with periodic idle time operation discussed above, where the average heat input from the electrode is 850 Watts and the heat input from the fan is 500 Watts. We also assume for this simplified approximation that all heat is removed through the heat exchanger. Under these assumptions, short term temperature decreases during idle periods are limited to about 11° C. At that point heat input into the gas from the walls and components are equal to heat extracted by the heat exchanger. During a short period of continuous operation, the electrodes will add heat at the rate of about 2000 Watts. This, on top of the 500 Watts input from the fan, would cause a rapid rise, at the rate of about 3.7° C. per ¹⁄₁₀ second, ((2.5 KW–1.35 KW)/0.62J/gm°C.) (500 gm)=37° C./sec)), in the average temperature in less than one second the gas temperature has increased significantly and the heat removed by the heat exchanger and the walls is greatly increased. At 58° C. the heat removed would equal the 2500 Watts. This would set the upper limit of short term transients.

Test Data with Very Fast Thermocouple

Figure 2:
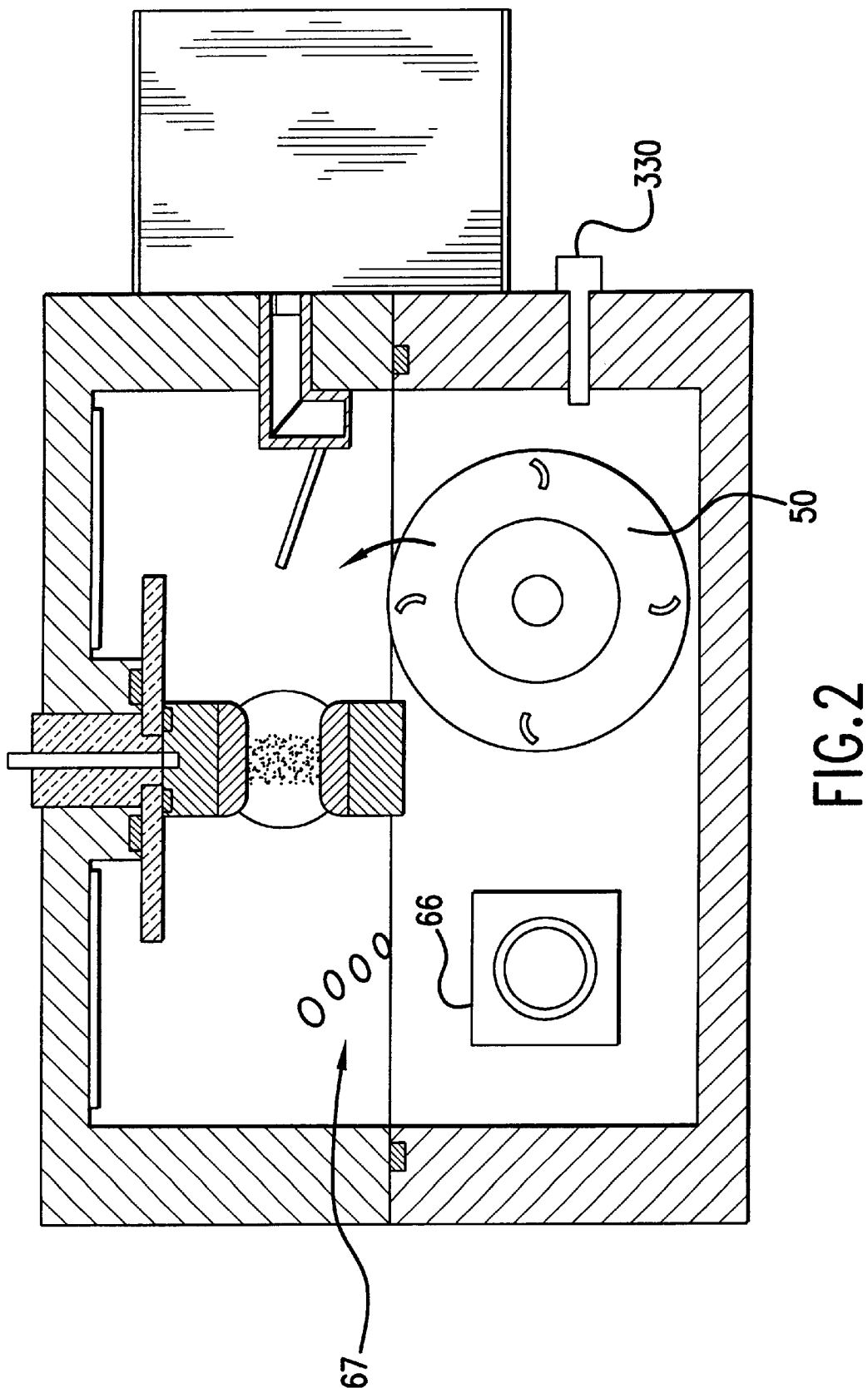
FIG. 2 shows the temperature control element of the prior art laser.
Figure 20A:
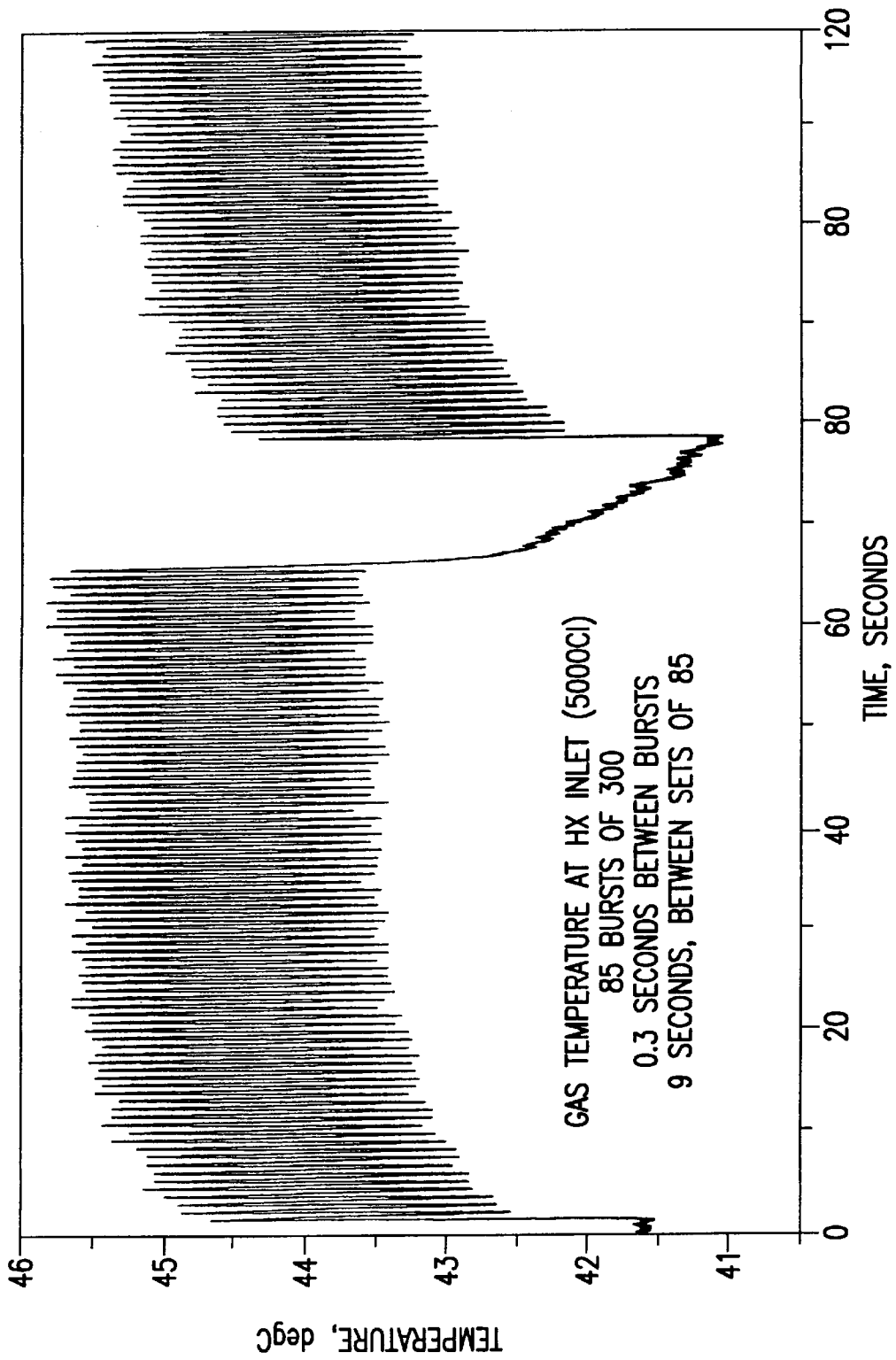
Figure 20C:
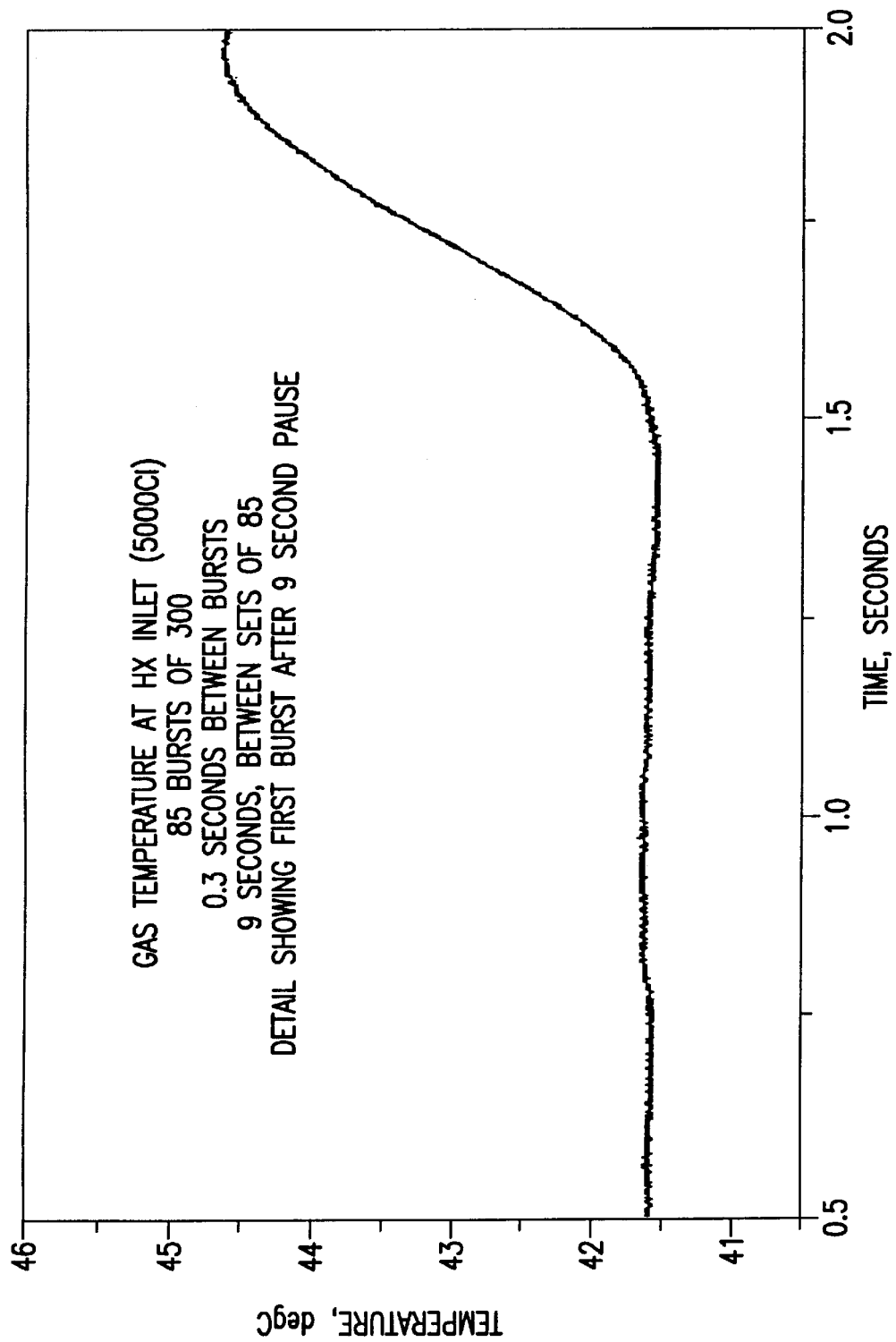

FIGS. 20A, 20B and 20C show test data taken during operation in the above described sixty second cycle burst mode operation, and the temperature data graphed were obtained with an Omega K type 0.010 inch diameter thermocouple (P/N 5+C-TT-K-30-72) mounted just above the heat exchanger and downstream of the electrodes. The thermocouple has a response time of about 0.26 second (260 millisecond). The data clearly show the eighty five ±0.3 second swings and the large temperature decrease during a 9-second idle period. As indicated in FIG. 20C, the sensor was not fast enough to detect the 40 millisecond slug effect. The data plotted in FIG. 20B show the cycling result of the prior art laser temperature controls which are controlling cooling water flow to the heat exchanger in response to signals from the prior art temperature sensor shown at 330 in FIG. 2 which has a response time of a few seconds. The controller controls a proportional flow valve which was programmed in this situation to be fully open at a gas temperature of 60° C. and fully closed at a gas temperature of 50° C. and proportionally open for temperatures in between. The result was 60 second cooling water cycling effect superimposed on the cyclical effects of the 0.3 second bursts and 0.3 second idle period and the 9 second idle period. The cooling water caused swings are a few degrees.

Need for Better Temperature Control

The analysis provided above is based on Applicants' experiments and observations of 1000 Hz KrF laser operation. The temperature swings shown in FIGS. 3–6 are not severe for the 1000 Hz KrF laser and excellent performance with stable pulse energy and other beam parameters have been provided by those lasers. More recently Applicants have been experimenting with 2000 Hz KrF excimer lasers providing twice the power of the 1000 Hz laser and ArF 1000 Hz lasers and $F_2$ 1000 Hz lasers which are much more sensitive to temperature variations than the KrF laser. Future planned lasers are being designed by Applicants and their fellow workers to operate at 5000 Hz. Also, customers of Applicants' employer are insisting on tighter control of laser parameters such as wavelength, bandwidth, and energy stability, all of which can be adversely affected by laser gas temperature variations. (See FIGS. 19A, 19B and 19C.) For all of these reasons, better temperature control of the laser gas is necessary. This application discloses techniques and systems for providing much more precise control of laser gas temperature of electric discharge gas lasers than has been possible with prior art lasers of this type.

Use of Pressure to Indicate Temperature

The temperature sensor used to collect the data in FIGS. 20A, B and C is a relatively delicate instrument and would not survive for long periods in the laser gas environment. Thus, for fast temperature measurements with such an instrument, provisions could be made for quick replacement. Another alternative is to utilize a pressure detector to indicate fast temperature changes, since pressure changes instantly with temperature changes. The pressure data should be collected in between pulses so that acoustic shock effects of the discharges do not affect the pressure indications. A laser data acquisition processor should be programmed to convert the pressure data into temperature data using well known techniques. Preferably, these data can be correlated (at least once for each laser model) with data obtained with a fast temperature sensor such as the one discussed above.

Passive, Large, Surface Area, Temperature Stabilizer

Figure 8A:
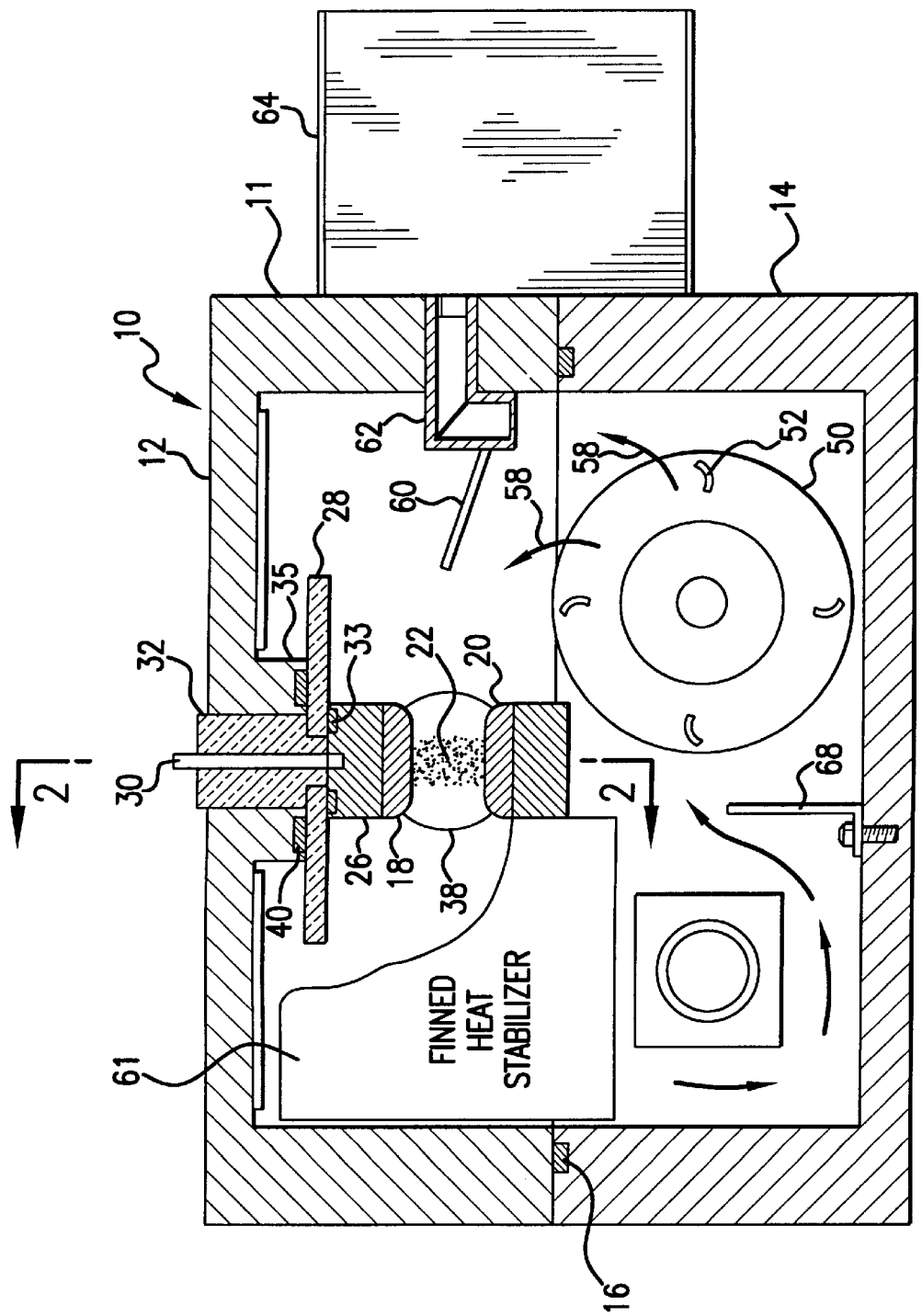
FIG. 8A shows a cross section of a laser chamber with a passive temperature.

A preferred improvement to electric discharge gas lasers for maintaining gas temperature close to an average gas temperature is shown in FIG. 8. This is a passive finned structure 61, which Applicants call a temperature stabilizer, positioned downstream of the electrodes. Each fin has a surface area (both sides) equal to about 135 $cm^2$ and there are about 225 fins spaced 8 per inch and the unit provides a total surface area in the gas flow path of about 3 square meters. This compares to the prior art passive average temperature surface area of about 1.6 square meters. Further, this unit is positioned directly in the gas flow path immediately downstream of the electrodes so that the average temperature of the stabilizer (during periods of burst operation) will be slightly higher than the average temperature of the gas. Applicant estimates that this unit will reduce periodic short term temperature fluctuations by at least a factor of four. Temperature stabilizer with larger or smaller surface areas could be utilized but for the type of lasers described in the "Background" surface area of at least 1 $m^2$ is recommended. Another good rule of thumb is to relate the surface area of the stabilizer to that of the finned heat exchanger. For good results a stabilizer area from 1 to 4 times the heat exchanger surface area could be specified.

The passive finned temperature stabilizer could be thermally joined to the chamber walls to provide some additional cooling by improving conduction through the walls or the unit could be insulated from the walls to minimize heat transfer outside. The advantages of both approaches, in light of the above descriptions, is obvious.

Another approach is to machine fins into the chamber walls and allow the walls to provide a very large thermal mass. The outside surfaces of the walls could be insulated which would allow the wall temperature to stabilize at a temperature approximately equal to the average gas temperatures at the inside surfaces. The reader should note that there will be some restriction to gas flow and an increase in fan power may be required. For specific applications, appropriate tradeoff decisions can easily be made by reducing or increasing the number of fins.

The finned temperature stabilizer (preferably copper) is also useful for neutralizing ions and charged particles in the flowing gas. The fins could be electrically insulated and charged to improve their attraction to ions and charged particles. The finned temperature stabilizer is also useful for absorbing acoustic shock waves produced by the discharge. In applications where these shock waves are a problem, structures should be provided on both sides of the chamber. To improve its shock absorbency, felt metal or ceramic foam may be added to the sink structure preferably along the edge of the sink near the chamber wall.

Figure 8B:
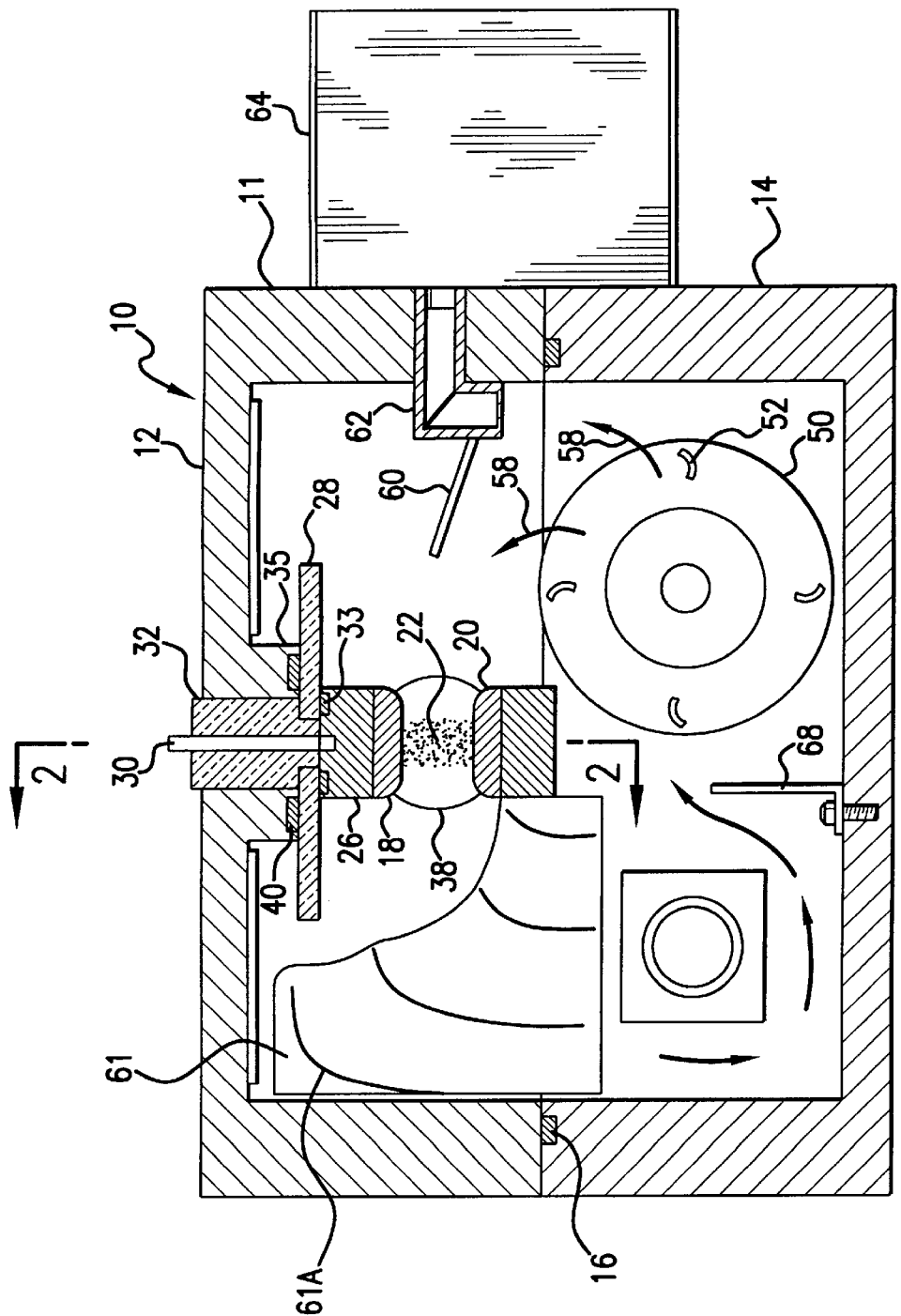
FIG. 8B shows a cross section of a laser chamber with a stabilizer with flow vanes.

Flow vanes could be added to the heat sink as shown at 61A in FIG. 8B which would not only improve flow and provide additional or alternate surface area but would also direct acoustic shock forces away from the electrodes and minimize reflections back into the discharge region.

Continuous Pulsing

As shown in FIG. 3 there is virtually zero temperature fluctuation in the laser gas when the laser operating continuously at for example 1000 Hz. This provides a possible solution to temperature fluctuations. The laser beam could be shuttered or dumped during intervals when the beam is not needed. Generally, this approach is not practical because it results in reduced useful life of many of the laser components especially the electrodes and certain sensitive optical components.

Two Birds with One Stone

Figure 18:
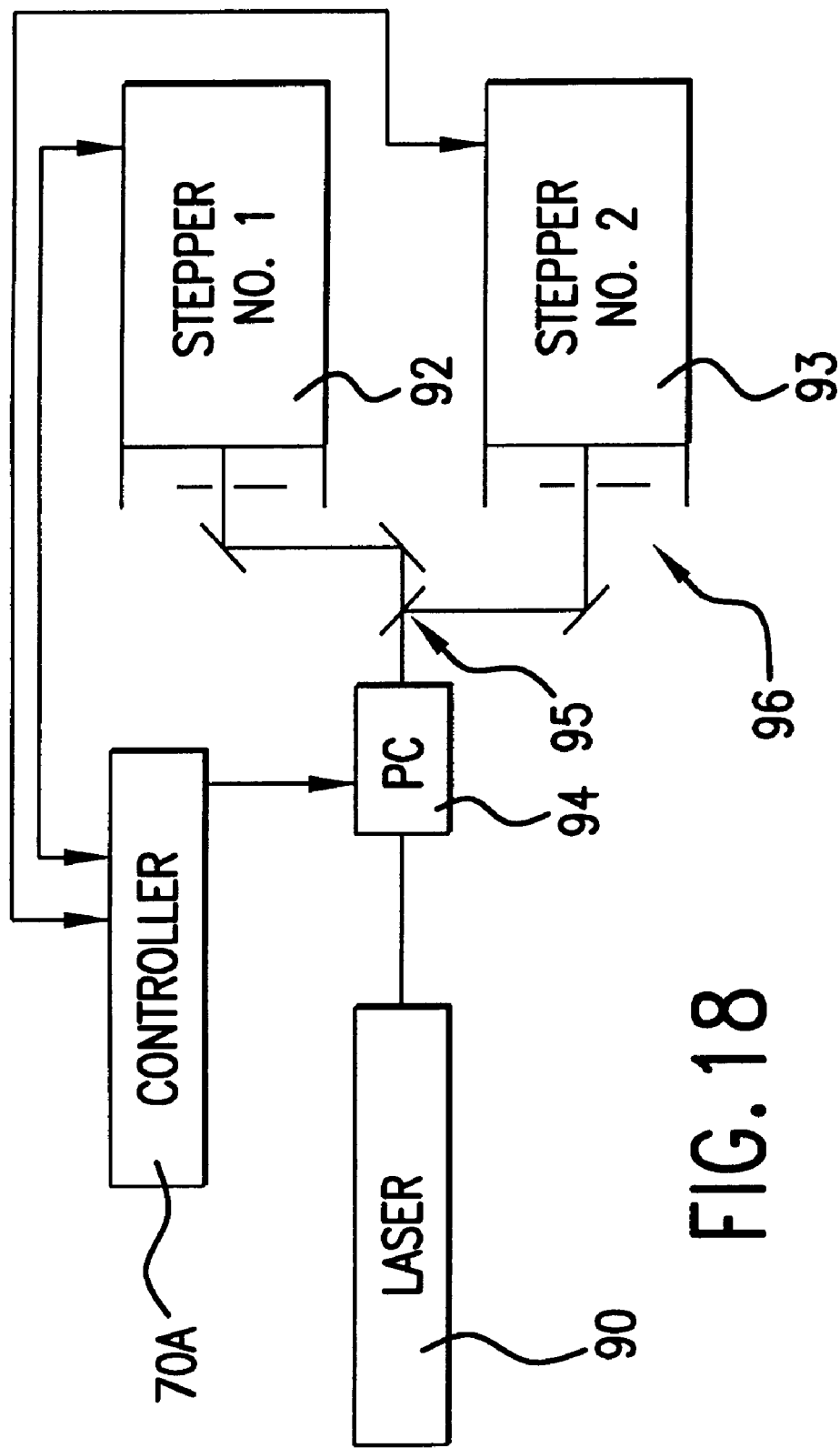
FIG. 18 shows a single laser operating continuously for illuminating two steppers with a Pockels cell for switching.

Another approach which could in some cases be used to "kill two birds with one stone" is shown in FIG. 18. Here a single laser 90 serves two steppers 92 and 93. The beam is switched back and forth between the lasers steppers with a polarizing beam splitter comprising a Pockels cell 94. The beam exiting laser 90 is polarized horizontally. On signals from controller 70A, Pockels cell 94 changes the polarization to vertical. Beam splitter 95 passes horizontal light and reflects vertical light. Therefore, two steppers could be illuminated by one laser with both steppers utilizing the operating mode of 1000 pulses per second, 300 pulses per burst with 0.3 second idle periods between illumination sites. The time required for the Pockels cell to switch the beam is insignificant. The steppers each would be provided with a shutter 96 to stop the beam during the 8 second downtime. This approach would permit the laser to operate continuously improving gas temperature regulation and at the same time permit one laser to do the work of two lasers. A similar approach would be to provide a second laser just like laser 90. This would allow one of the lasers to be kept in standby or one of the lasers could be serviced while the other illuminates both steppers. This should improve laser availability to almost 100%.

Two Sets of Electrodes

Figure 9:
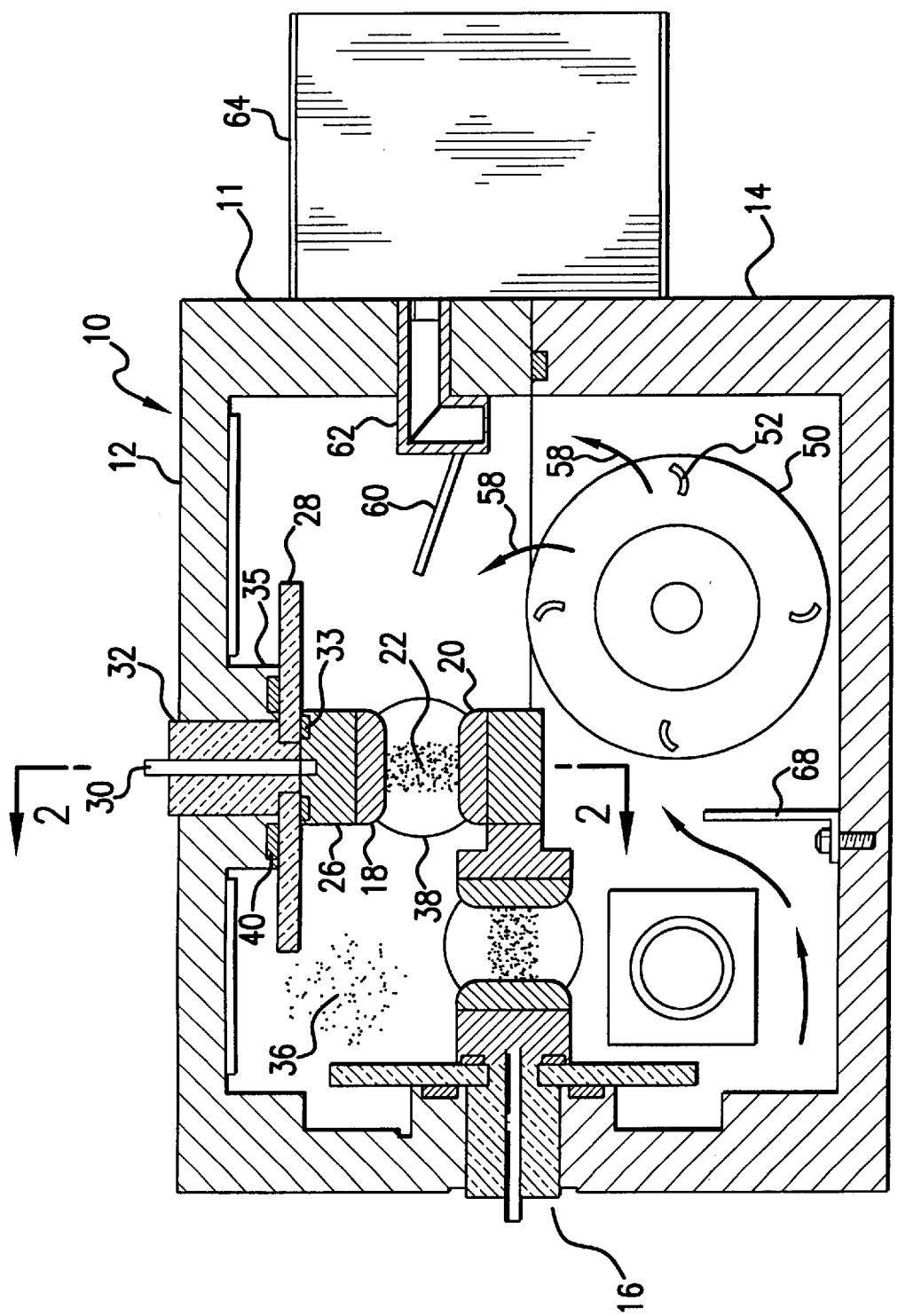
FIG. 9 shows a chamber cross section with an extra set of electrodes.

Another almost equivalent approach is to install a second set of electrodes 63 in the chamber as shown in FIG. 9 which are powered by the same pulse power supply as the main electrodes. This second set of electrodes would discharge whenever the primary electrodes are not discharging. This would eliminate average temperature swings and the slug effect. Wear on these electrodes would not materially affect laser performance. In fact, scrap electrodes could be used for the secondary electrodes.

Another alternative approach would be to operate the second set of electrodes to maintain uniform discharge cycles instead of continuous discharges. For example, in the burst mode discussed above representing a typical lithography cycle of 0.3 seconds on, 0.3 seconds off for 85 bursts followed by a 9 second idle period, the second set of electrodes could be operated 0.3 seconds on and 0.3 seconds off during the 9 second idle period. This would eliminate the large temperature swing during and following the 9 second idle period shown in FIG. 6. But the steady state 0.3 second swings would remain.

Direct Heating of Gas with Fast Heating Element

Figure 1:
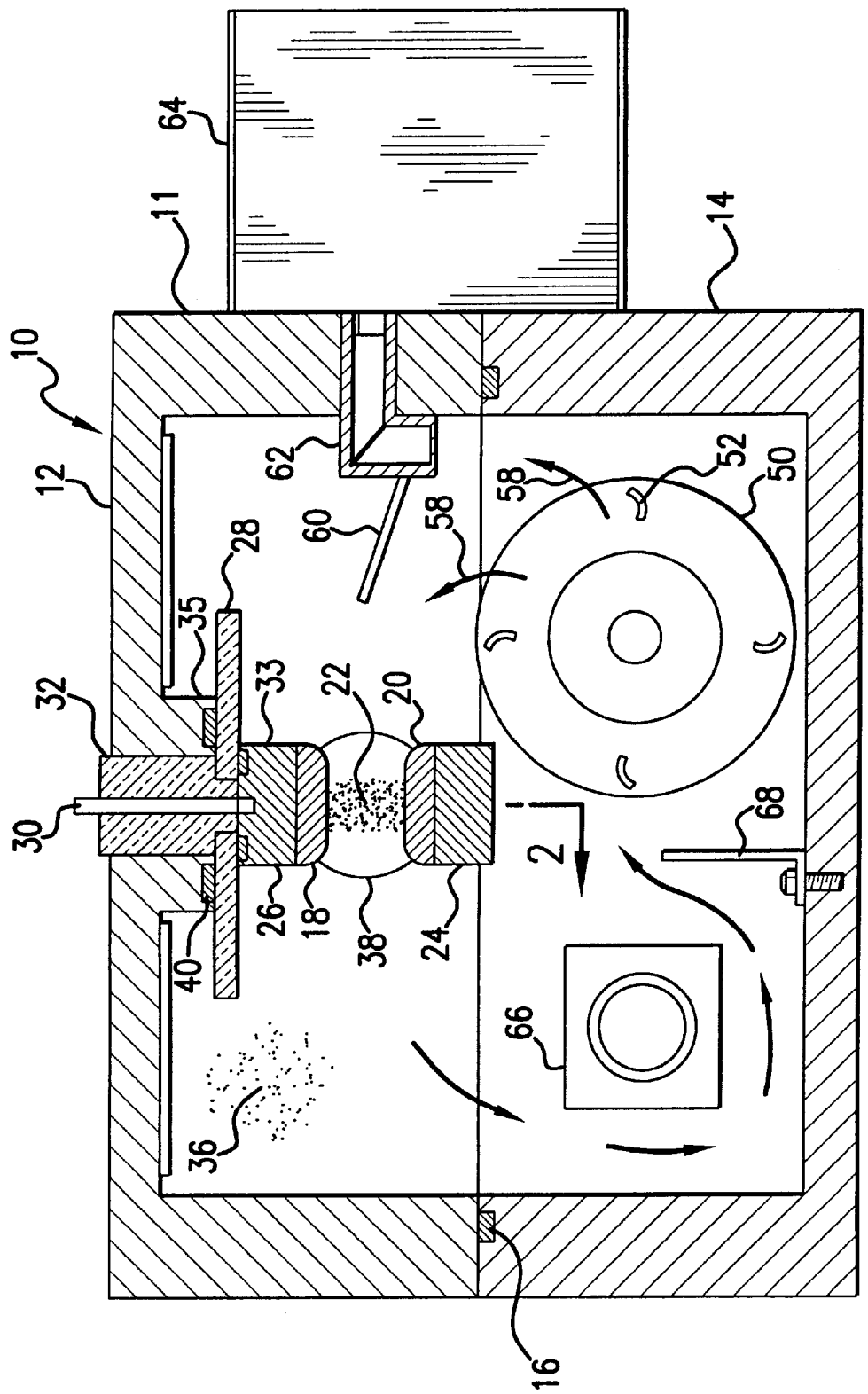
FIG. 1. shows the cross section of a prior art excimer laser used for integrated circuit lithography.

U.S. Pat. No. 5,748,656 proposes a rod element heater positioned in the gas for heating the gas during idle times. A problem with this solution is that rod heaters have so much thermal mass that by the time the rod gets hot the need for heating is often gone. A better approach is to utilize heating elements with minimal thermal mass for rapid heating of the gas. Ribbon heating elements comprised of monel or nickel could be stabilized for this purpose. Finned strip heaters such as Model OTF-252/240 available from Omega Engineering (with offices in Stanford, Conn.) may be used. These finned strip heaters preferably are positioned just downstream of the electrodes so that the fins provide an immediate heat contribution at the start of an idle time. A good location is the location of heater 67 in FIG. 2. A further possibility to achieve adequate response times from a heater located in the laser gas flow is to use the heat exchanger itself for both heating and cooling. If the heat exchanger, FIG. 1 item 66, were fabricated from aluminum it would be possible to anodize the outer surface with a coating thickness of up to 0.002". Then a layer of nickel preferably about 0.001" thick could be deposited over the top of the non-conductive anodized surface. With careful design of the end details it would be possible to pass a current through the nickel during laser idle periods to provide rapid heating of the gas due to its low thermal mass and high surface area in contact with the gas. It is estimated that, assuming the resistance of the plating is about 0.3 ohm for a 0.001" thick layer, 48 volts at 100 amps would give about 5 kW of heat input to the system and response times would be fast enough to avoid the rapid chilling of the gas that occurs otherwise. A further refinement is to control these gas heaters based on operational information from the slipper or scanner so that any short delay in heater performance is anticipated so that the gas temperature fluctuations are minimized.

Periodic Heating of Water

Figure 10:
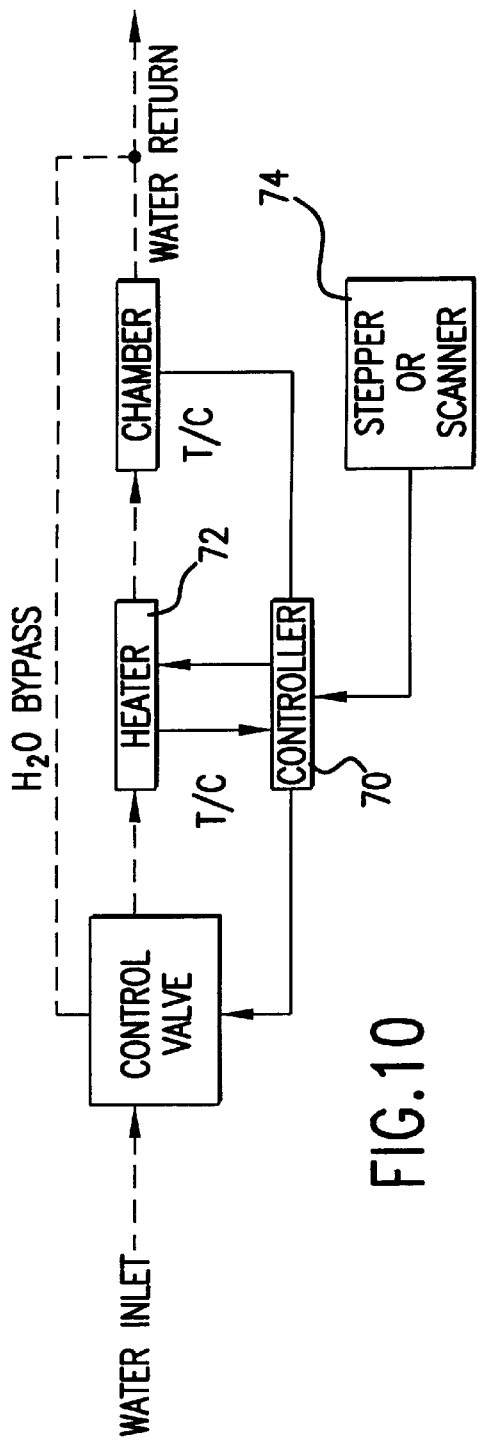
FIG. 10 shows a system for providing heat to the laser cooling water.
Figure 11:
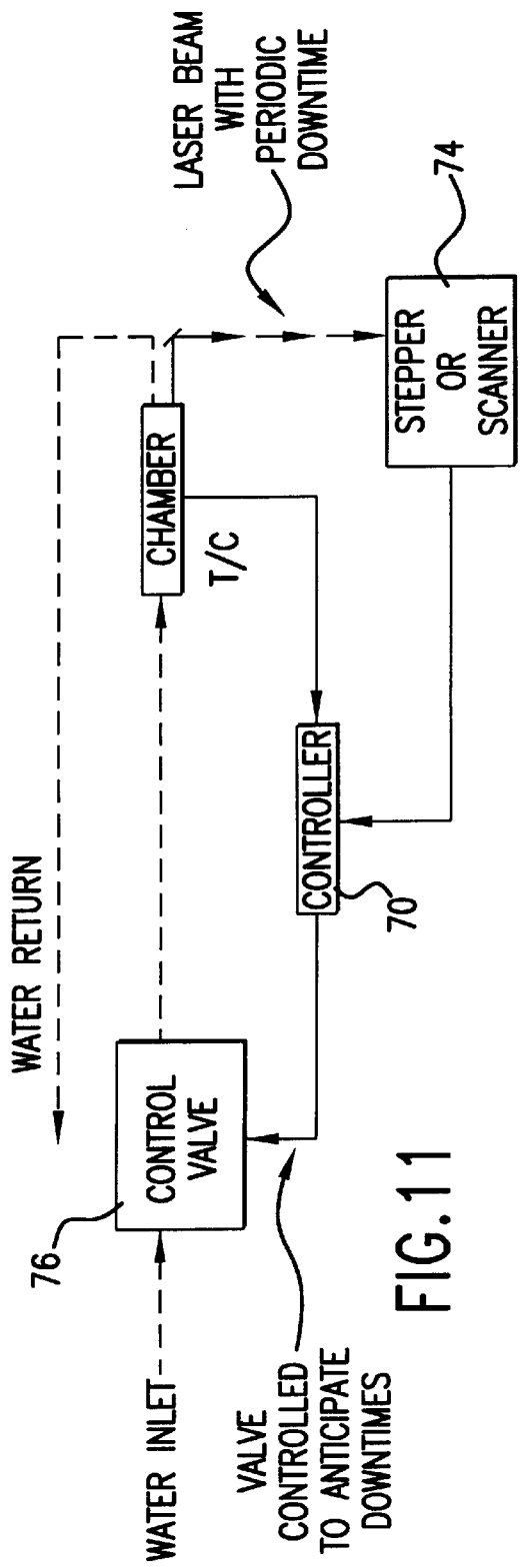
FIGS. 11 and 12 show modifications of the FIG. 10 system which anticipates idle periods.

A similar technique for minimizing laser gas temperature fluctuations is shown in FIG. 10. Here heat is added directly to the cooling water to compensate for relatively long periods during which the laser is not operating. The hotter water has the effect of reducing the efficiency of the heat exchanger for removing heat from the chamber. In a preferred embodiment (for example to minimize the temperature swing resulting from the 9 second idle period, in the above described operating mode, for changing wafers), controller receives a signal from the stepper or scanner 74 in advance of idle periods, such as at the start of a series of bursts. Controller 70 is programmed to turn heater 72 on and off on a cycle which is calculated to minimize the gas temperature fluctuation due to the extended (9 second in this example) several-second idle period. For example, if tests show that it takes 6 seconds for heat from the water heater to begin causing an increase in the gas, temperature controller might preferably be programmed to turn on heater 72 for 9 seconds, 45 seconds after the start of the cycle so that the effects of the heater is seen by the laser gas 51 seconds after the start of the cycle and at the beginning of the idle period. Actual timing for best results should be established by actual experimentation. Longer term idle periods preferably are compensated for by reducing water flow.

Where control of the heating element from the stepper or scanner is not desired, another approach is to program the controller to look for patterns in the laser operation such as the one described above of 85 bursts then a 9 second idle period. If the controller detects such a pattern, it could initiate a heating cycle to best minimize the gas temperature fluctuations. Patterns could be determined by having the controller analyze pulse history data. Patterns could also be determined using gas temperature data. A fast temperature detector (less than 0.1 second) would be preferred for best results. Chamber pressure signals from a pressure transducer mounted in the chamber could also be used to infer chamber temperature changes. These pressure signals would provide a much faster indication of average temperature changes than typical temperature detectors.

Smart Flow Control

Figure 12:
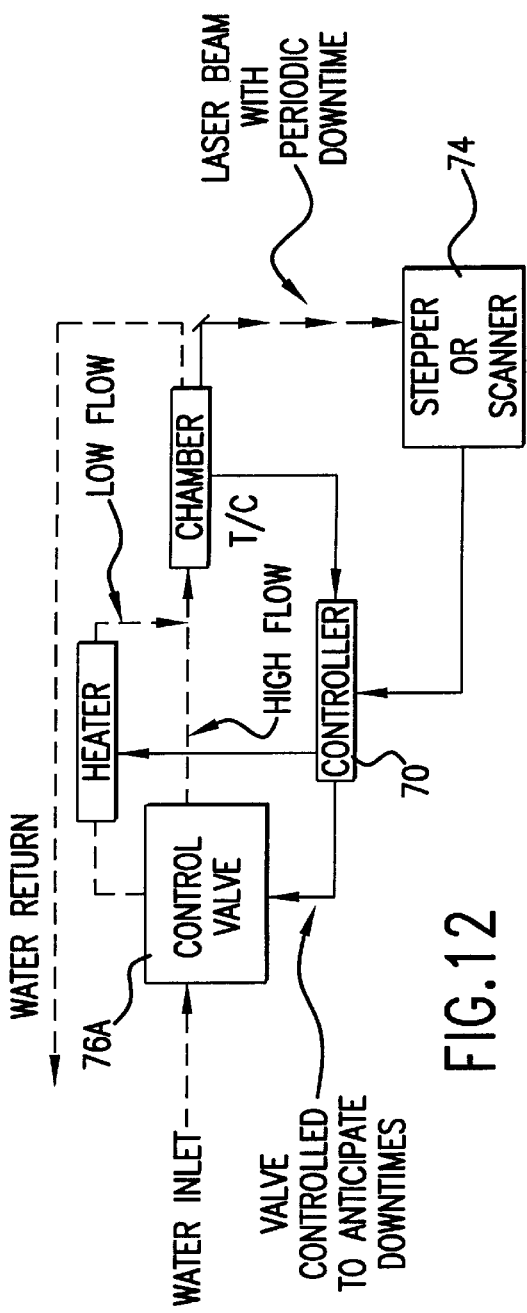

Another embodiment of this invention similar to the one described above is shown in FIG. 12. Here the stepper or scanner 74 is programmed to send signals to controller 70 which is used by controller 70 to close (partly or fully) for a short period control valve 76 in anticipation of a soon-to-come short (few seconds) idle period. The timing of the short closure is determined by experiments simulating a preferred operating mode so as to minimize laser gas temperature fluctuations resulting from the idle period. For example, if tests show that there is a 25-second delay between valve closure and the resulting effect on the gas temperature, the closure should be called for 25 seconds in advance of the beginning of the idle period. A slight modification to this approach is to only partially close the valve instead of fully closing it so as to better tailor the closing period to the cooling period during the idle period of the laser.

Flow Control With Water Heating

Figure 13:
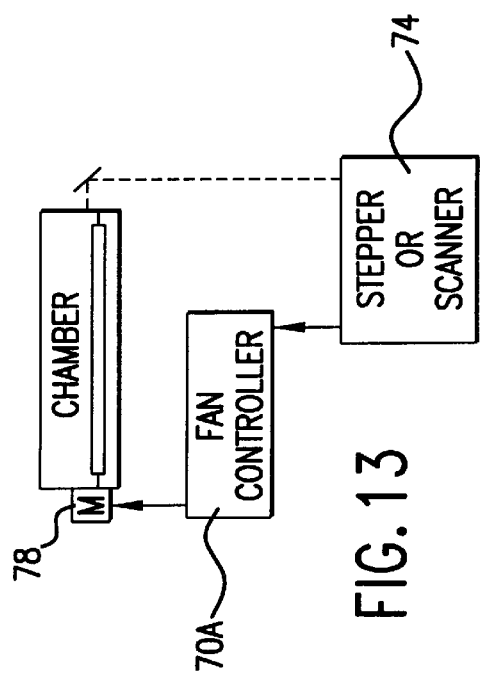
FIG. 13 shows a system using fan heat to maintain temperature.

FIG. 13 shows an embodiment which is a combination of smart water flow control and water heating to control gas temperature transients. Here the controller operates control valve 76A (which in this case is a two-way valve) at the start of or in anticipation of a short downtime. A much reduced flow is directed through heater 72A so that a reduced flow of hotter water passes through the finned heat exchanger in the chamber during or in anticipation of the downtime. Preferably a separate valve (not shown) is used to regulate the high flow during lasing intervals. The position of this valve could be set by the controller based on the laser gas temperature averaged over a relatively long time period such as a few minutes. Also, a time weighted averaging algorithm could be used along with gas temperature measurement to adjust the flow so as to minimize oscillations. An example follows:

$$(T_{WA})_o = 0.1 T_o + 0.1 T_{-1} + 0.8 (T_{WA})_{-1}$$

where:

$(T_{WA})_{-1}$ is the current weighted average temperature $T_o$ is the current measured temperature $T_{-1}$ is the measured temperature at 1 second previously (i.e., −1 second)

$(T_{WA})_{-1}$ is the weighted average temperature at −1 second

Changing Fan Speed

Another preferred embodiment of the present invention is demonstrated by reference to FIG. 13. In this case, the stepper or scanner 74 sends a signal to fan controller 70A to increase the speed of fan motor 78 during short idle periods to provide extra heat to the gas to maintain gas temperature during the idle period. The reader should be aware that this concept can be used only if the fan is designed for the higher speed needed to input the necessary energy into the gas. Also, higher speeds will probably improve the efficiency of the heat exchanger. Therefore, experiments should be performed to determine for a given system the correlation of fan speed with heat input. This concept is well suited for use on laser systems which utilize magnetic bearings to support the fan. With these systems there is no problem of additional bearing wear due to the higher fan speeds.

Phase Change Temperature Stabilizer

Another preferred embodiment of the present invention is a modification of the temperature stabilizer referred to above. In this case, the metal (preferably copper) stabilizer unit comprises an enclosed cavity partially filled with a material having a phase change temperature equal to or approximately equal to a desired laser gas temperature. Some preferred phase change materials are listed below with their melting points:

| Material | Melting Points |
| --- | --- |
| Nickel nitrate | 56.7° C. |
| Silicon Tetradicloride (SiCl$_4$) | 70.3° C. |
| Azobenzene (C$_6$H$_5$N)$_2$ | 69.1° C. |

Figure 14:
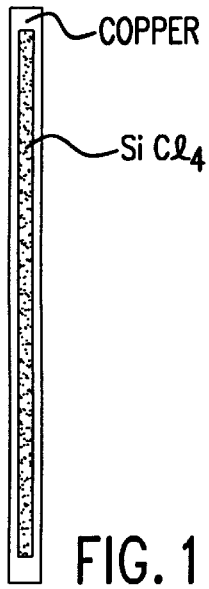
FIG. 14 shows a pin cross section containing a phase change material.

For example, using SiCl$_4$ an operating at a gas temperature of 70.4° C., most or all of the SiCl$_4$ would be melted. During short idle periods when the gas temperature drops below 70.3° C., the SiCl$_4$ begins to freeze releasing energy to help maintain the gas temperature near 70.3° C. FIG. 14 shows the cross section of a copper sandwich type fin filled with SiCl$_4$. If desired, the temperature stabilizer could be designed so that the phase change material could be changed by providing inlet and outlet ports where hot liquid could be pumped into the chamber to fill the phase change material chambers. This would permit the laser operator to insert a different phase change material if a different average gas temperature were to be desired. Also, a liquid-to-gas phase change material could be utilized, but the design must make provisions to handle the resulting liquid-to-gas expansion.

Refrigerant Cooling

Figure 15:
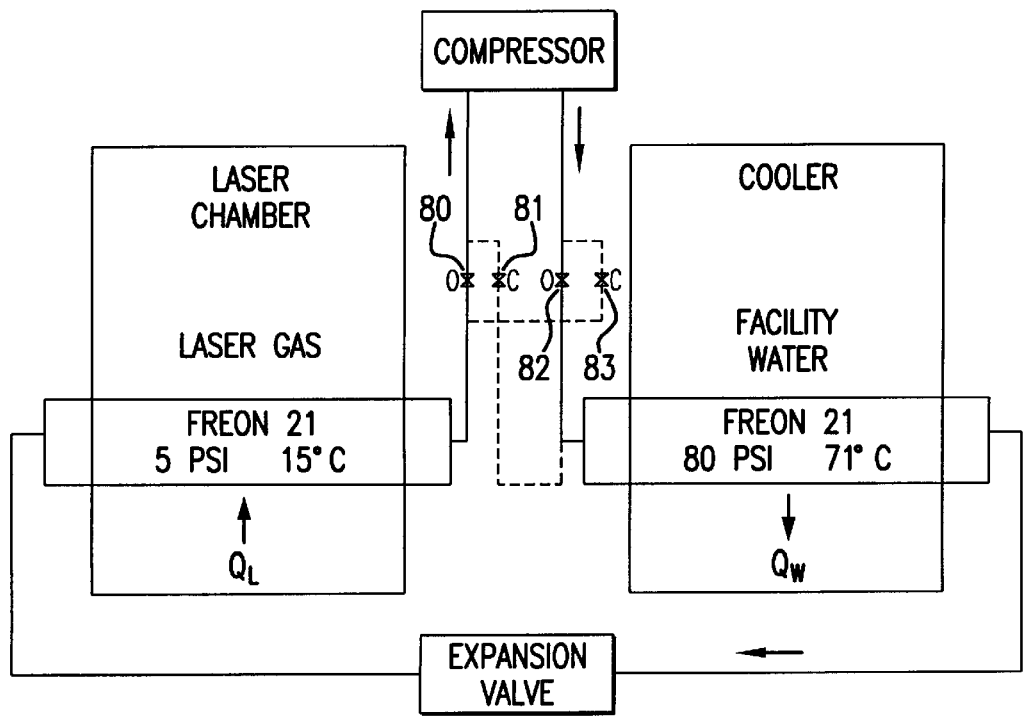
FIG. 15 shows a cooling system with evaporation cooling.

An additional embodiment of the present invention utilizes an evaporating refrigerant instead of a single phase element such as water as the primary cooling agent for the laser. FIG. 15 shows a preferred thermal cycle. The refrigerant (such as Freon or R134a) evaporates in the chamber. In a preferred embodiment the evaporating unit may be made a part of the walls of the chamber and fins are machined into the inside walls of the chamber. The heat exchanger can be designed with a very large fin surface area sufficient heat can be removed with a small ΔT between the average fin surface temperature so that temperature swings resulting from burst mode operation are greatly reduced. Of course the ΔT between the gas temperature and the refrigerant is greater than with water.

The reader should note that the system shown in FIG. 15 can be operated in reverse (like a heat pump) in which case gaseous phase coolant is compressed and liquefied in the heat exchanger which results in a phase change which adds heat to the chamber. Such reversal (which can be accomplished by closing valves 80 and 82 and opening valves 81 and 83) should normally be needed only for start up or for long idle periods of more than many minutes or longer.

This refrigerated cooling can be accomplished by a "cold finger" which stays with the laser frame when the chamber is removed. It is inserted into a hollow cylinder extending from one side of the laser chamber to the other side with fins extending into the laser gas. This permits the laser chamber to be removed from the laser frame without disconnecting Freon lines. Helium can be used in the space between the cold finger and the inside of the cylinder to improve heat transfer.

Pid Controlled Flow

Figure 16:
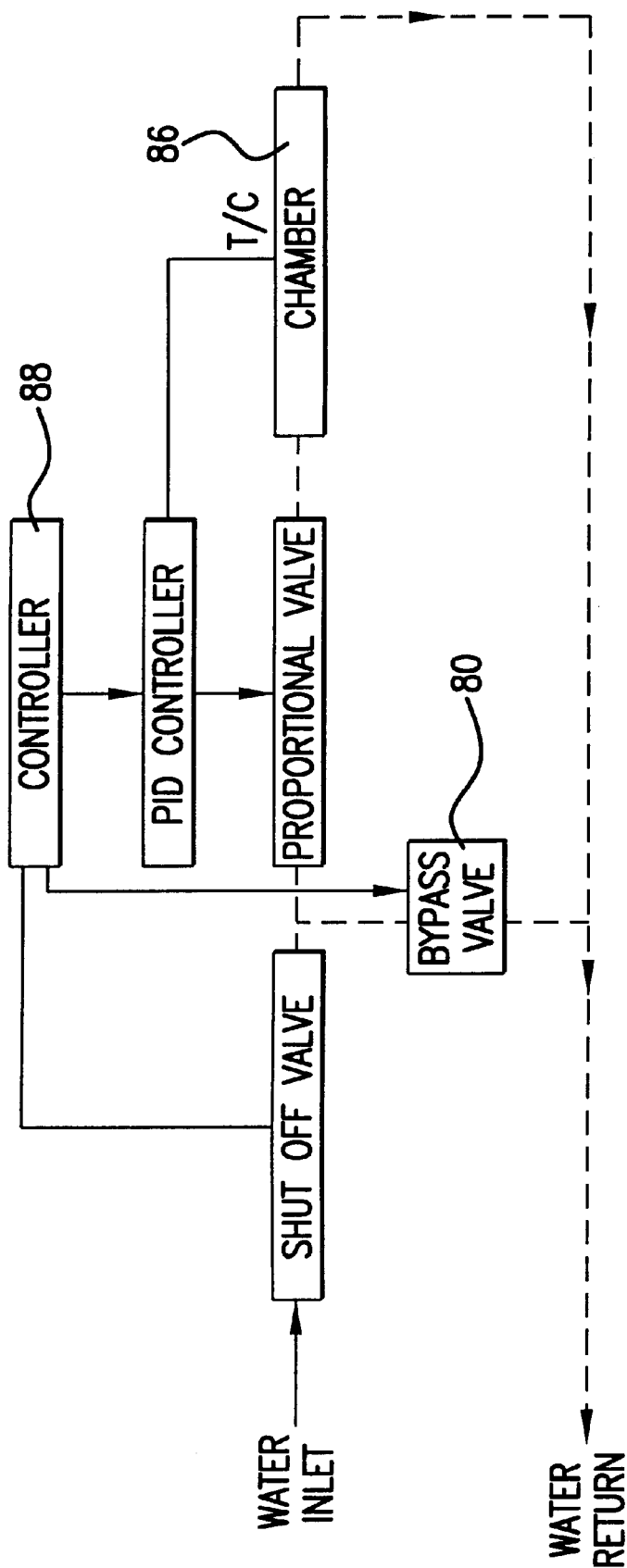
FIG. 16 shows a cooling system using PID control.

FIG. 16 shows an embodiment in which cooling water flow is controlled by a proportional integral derivative (PID) controller while the laser is operating in a continuous burst mode. A bypass circuit 80 may be provided so that flow can be reduced to very low levels or shut off during idle periods. As explained above, controls for the valve can be provided by a smart system which anticipates idle periods. The PID controller 82 regulates proportional valve 84 based on temperature signals from chamber 86 and instructions from controller 88 which may be a part of the laser system or part of a stepper or a scanner.

Two Way Flow

Figure 17A:
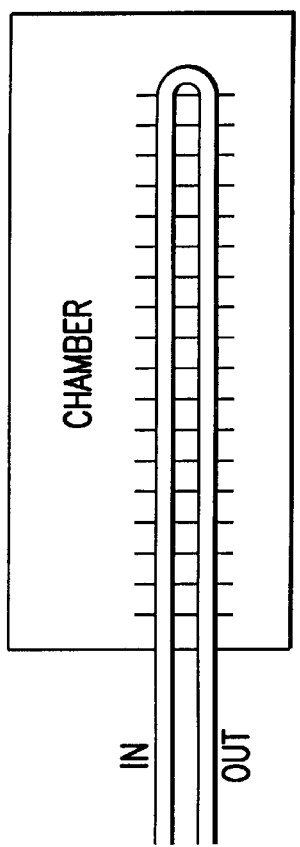
FIGS. 17A and 17B show U-Tube and 2-Tube heat exchangers.

At low cooling water flow the heat exchanger fin temperature will be hotter at the water exit end than the water inlet in. To minimize this effect a U-tube heat exchanger could be used or two straight tubes with inlets at appropriate ends of the chamber could be used as shown in FIG. 17A and 17B.

Two Tube Chamber Cooling With Fan Motor Cooling

Figure 17B:
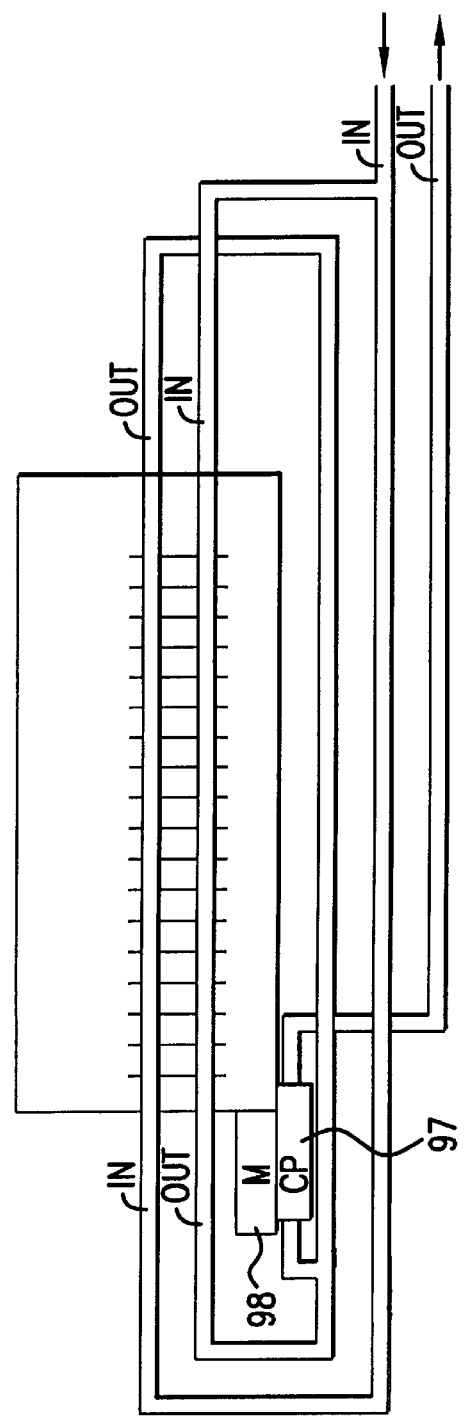

The FIG. 17B system built by Applicants passes the output of the two tubes through a cold plate 97 mounted on stator of fan motor 98. Prior art fan motors were cooled by a fan mounted to blow air on the motor housing. At low duty cycles one of the two tubes can be valved off (using valves not shown) so that half of the heat exchanger acts as a passive temperature stabilizer. This effect can be improved by having a separate set of fins associated with each tube.

Adjustable Heat Exchanger Vane

Figure 21A:
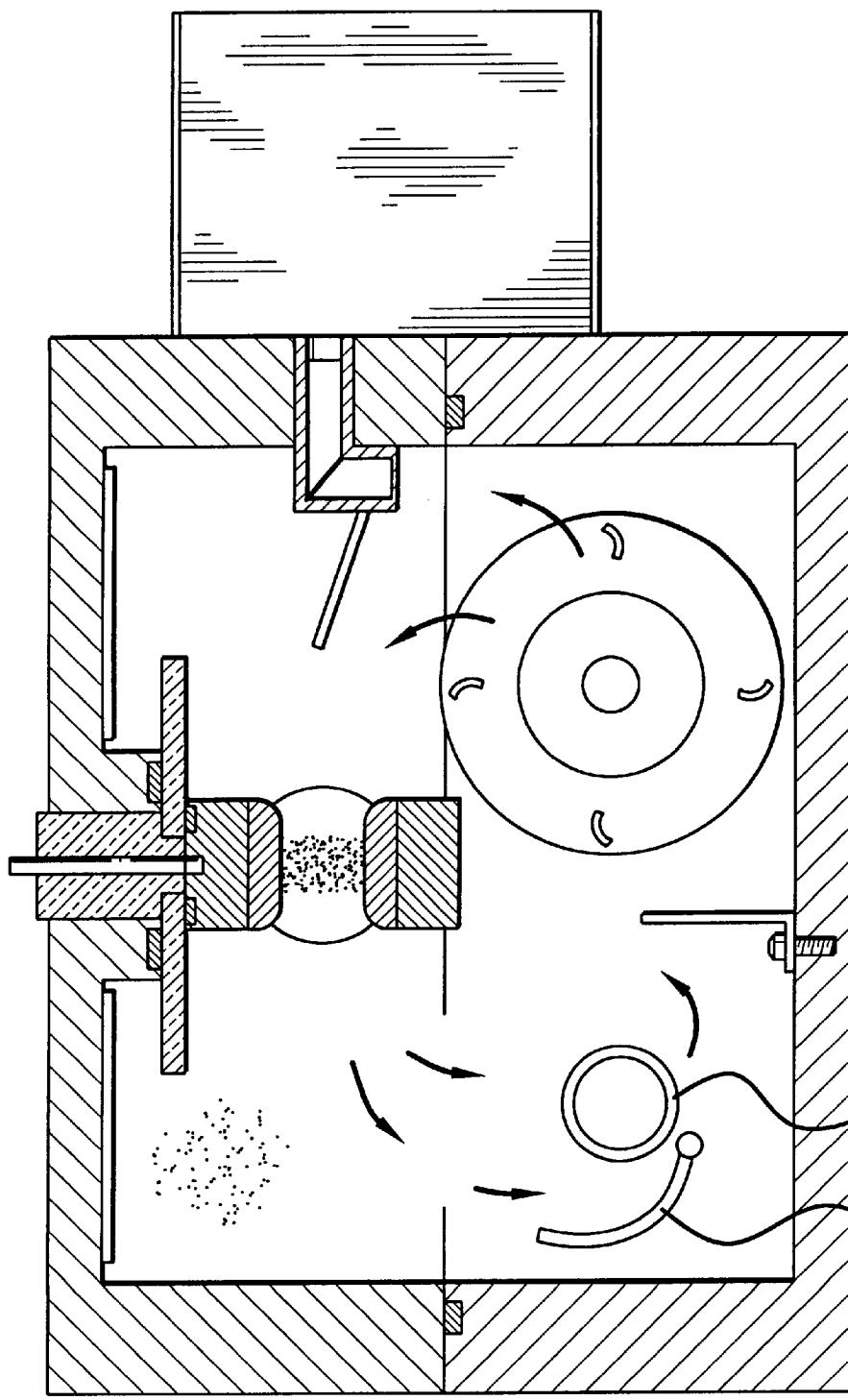
FIGS. 21A and 21B show an adjustable heat exchanger vane.
Figure 21B:
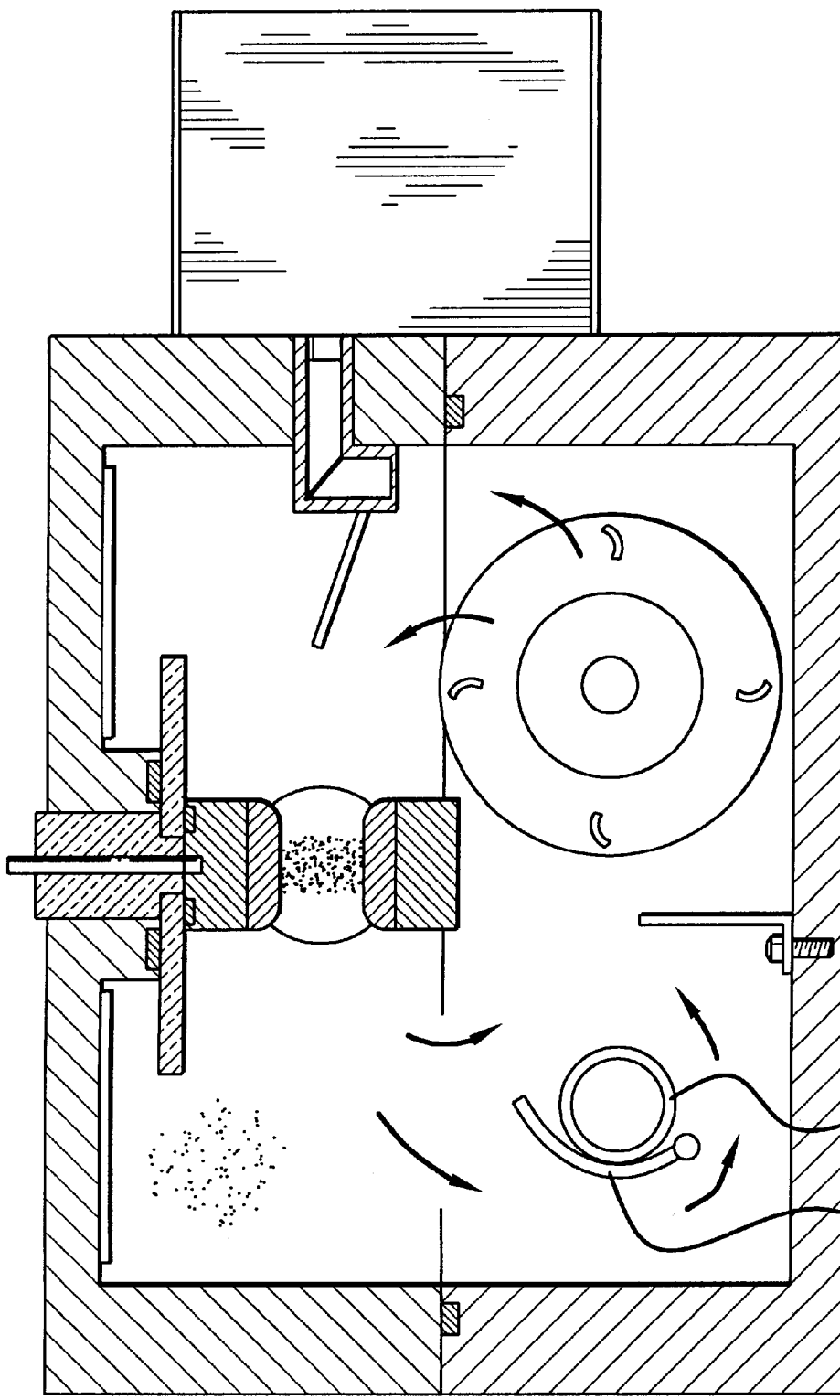

FIGS. 21A and 21B show an embodiment in which short term gas temperature fluctuations are moderated by an adjustable vane 99 which directs gas flow around heat exchanger 66 when the laser is in an idle period. Preferably the vane is controlled with a two-position magnetic coupler with the coils of the solenoid located outside the laser cavity. For more precise control several vane positions could be provided. Provision could also be made for linear control of the heat exchanger vane position.

While particular embodiments of the present invention have been shown and described, it will be obvious to those skilled in the art that changes and modifications may be made without departing from this invention in its broader aspects. Therefore, the appended claims are to encompass within their scope all such changes and modifications as fall within the true spirit and scope of this invention.

What is claimed is:

1. A gas discharge laser system with fast response temperature control for controlling gas temperature within desired limits during burst mode operation in which:
   1) heat is added to the laser gas by electric discharge in bursts of pulses with a pulse rate of about 2000 Hz or greater and heat rates in excess of 4 kw/sec for short time periods such as about ⅓ second followed by a short time idle period such as about ⅓ second during which no heat is added to the laser gas by electric discharge, and
   2) following a large number of such bursts, such as about 85 bursts, there follows a longer idle period such as about 9 seconds during which time no heat is added to the laser gas by electric discharge;
   said laser comprising,
   A. a laser chamber
   B. at least two elongated electrodes disposed in said laser chamber;
   C. a high voltage pulse power source for producing electric discharges between said elongated electrodes;
   D. a laser gas contained in said laser chamber;
   E. a fan for circulating said laser gas between said two elongated electrodes;
   said electric discharges and said fan adding heat to said laser gas over several minutes of such burst mode operation at a heat addition rate defining an average heat addition rate,
   F. a laser gas temperature control system for maintaining laser gas temperatures within desired limits when operating in a burst mode, said temperature control system comprising:
      1) a heat exchanger for removing heat from said laser gas said heat exchanger having a heat removal capacity exceeding said average heat addition rate,
      2) a fast acting temperature control means providing temperature responses at time periods of less than a fraction of one second,
   wherein said fast response temperature control is capable of controlling laser gas temperature to within a desired temperature range of less than 8° C. during such burst mode operation.

2. A laser as in claim 1 wherein said fast acting temperature control means comprises a passive temperature stabilizer having a surface area exposed to said laser gas greater than 1 m².

3. A laser as in claim 1 wherein said fast acting temperature control means comprises an actively cooled heat exchanger defining a heat exchanger surface area exposed to said laser gas said passive temperature stabilizer having a surface area equal to said cooled heat exchanger surface area.

4. A laser system as in claim 3 wherein said temperature stabilizer comprises a cavity at least partially filed with a phase change material.

5. A laser system as in claim 4 wherein said phrase change material has a phase change temperature within a few degrees of a desired gas temperature.

6. A laser as in claim 5 wherein said phase change material is chosen from a group consisting of nickel, nitrate, silicon tetradicloride and azobenzene.

7. A laser system as in claim 1 said heat exchanger is a water cooled heat exchanger with water flow control wherein said temperature control system comprises a processor programmed to control said laser in a continuous burst mode over periods of at least one hour with said water flow control maintained constant, wherein said gas temperature is maintained stable within a desired range by regulating electrical heat input into said laser gas through said electrodes.

8. A laser system as in claim 7 and further comprising a beam switch system wherein said laser is configured to provide illumination, alternatively to at least two lithography devices.

9. A laser system as in claim 7 wherein said beam switch system comprises at least one Pockels cell and at least one polarizing beam splitter.

10. A laser as in claim 1 wherein said fast acting temperature control means comprises electrodes wherein said high voltage pulse power source is programmed to provide high voltage pulses to each of two pairs of electrodes so as to maintain relatively constant, discharge heat into said laser chamber.

11. A laser system as in claim 1 wherein said fast acting temperature control means comprises a coolant cooled heat exchanger comprising a fast acting heater and a heater control system programmed to control said heater to maintain said laser gas temperature within a desired range during burst mode operation.

12. A laser system as in claim 11 wherein said heater control system is programmed to activate said heater in advance of idle periods so as to maintain said gas temperature within a desired range during said idle period.

13. A laser system as in claim 11 wherein said heater control system comprises a processor programmed to detect repetitive laser operation, to predict, based on said detected repetitive operation, in advance laser down time periods and to activate said heater in advance of idle periods.

14. A laser as in claim 11 wherein said heater is configured to directly heat said laser gas.

15. A laser as in claim 11 wherein said heater is configured to heat said coolant.

16. A laser system as in claim 1 wherein said heat exchanger comprises a coolant cooled heat exchanger and a fast flow control system to control coolant flow to said heat exchanger.

17. A laser system as in claim 16 wherein said fast flow control system is programmed to reduce coolant flow in advance of idle periods so as to maintain gas temperature within a desired range during said idle periods.

18. A laser system as in claim 1 wherein said fast flow control system comprises a processor programmed to detect repetitive laser operation and to predict, based on said detected repetitive operations, in advance laser idle periods and to reduce coolant flow in advance of said idle periods.

19. A laser system as in claim 1 and further comprising a fan control system programmed to increase fan speed during idle periods so as to increase fan heating of said laser gas.

20. A laser system as in claim 1 wherein said heat exchanger is a water cooled heat exchanger.

21. A laser system as in claim 20 wherein said water cooled heat exchanger is a two-tube heat exchanger comprising a first tube and a second tube wherein said heat exchanger is configured so that water flows in the first tube in a direction opposite to water flow in the second tube.

22. A laser system as in claim 21 wherein flow in said first tube can be stopped so as to convert a portion of said heat exchanger into a passive temperature stabilizer.

23. A laser as in claim 21 and further comprising an electric motor driving said fan wherein water flow exiting each of said two tubes is utilized to cool said motor.

24. A laser as in claim 20 and further comprising a PID controller.

25. A laser system as in claim 1 wherein said heat exchanger is a refrigerant cooled heat exchanger.

26. A laser as in claim 25 and further a refrigerant control system having reverse features to permit the heat exchanger to add heat to the laser chamber.

27. A laser as in claim 25 wherein said refrigerant cooled heat exchanger comprises a cold finger.

28. A laser as in claim 1 and further comprising a heat exchanger and an adjustable heat exchanger vane for directing flow toward or away from a said heat exchanger.

* * * * *

UNITED STATES PATENT AND TRADEMARK OFFICE
CERTIFICATE OF CORRECTION

PATENT NO. : 6,034,978
DATED : March 7, 2000
INVENTOR(S) : Ujazdowski et al.

It is certified that error appears in the above-identified patent and that said Letters Patent is hereby corrected as shown below:

Title page:

In the figure, change the second and lower occurrence of "DOWNSTREAM" to --UPSTREAM--.

Figure 5:
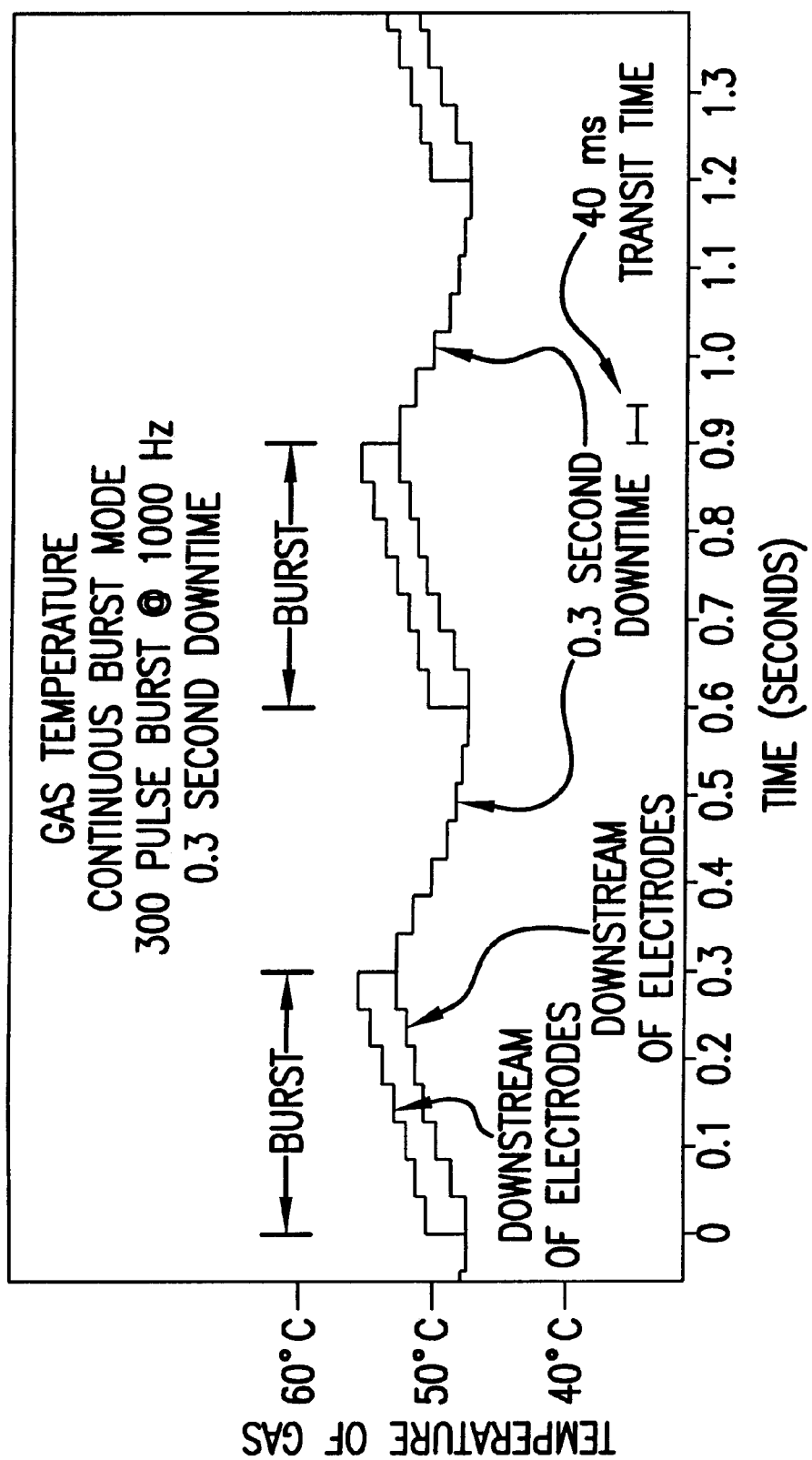
FIG. 5 shows the temperature of gas approaching electrodes with a continuous burst mode of operation.
Figure 6:
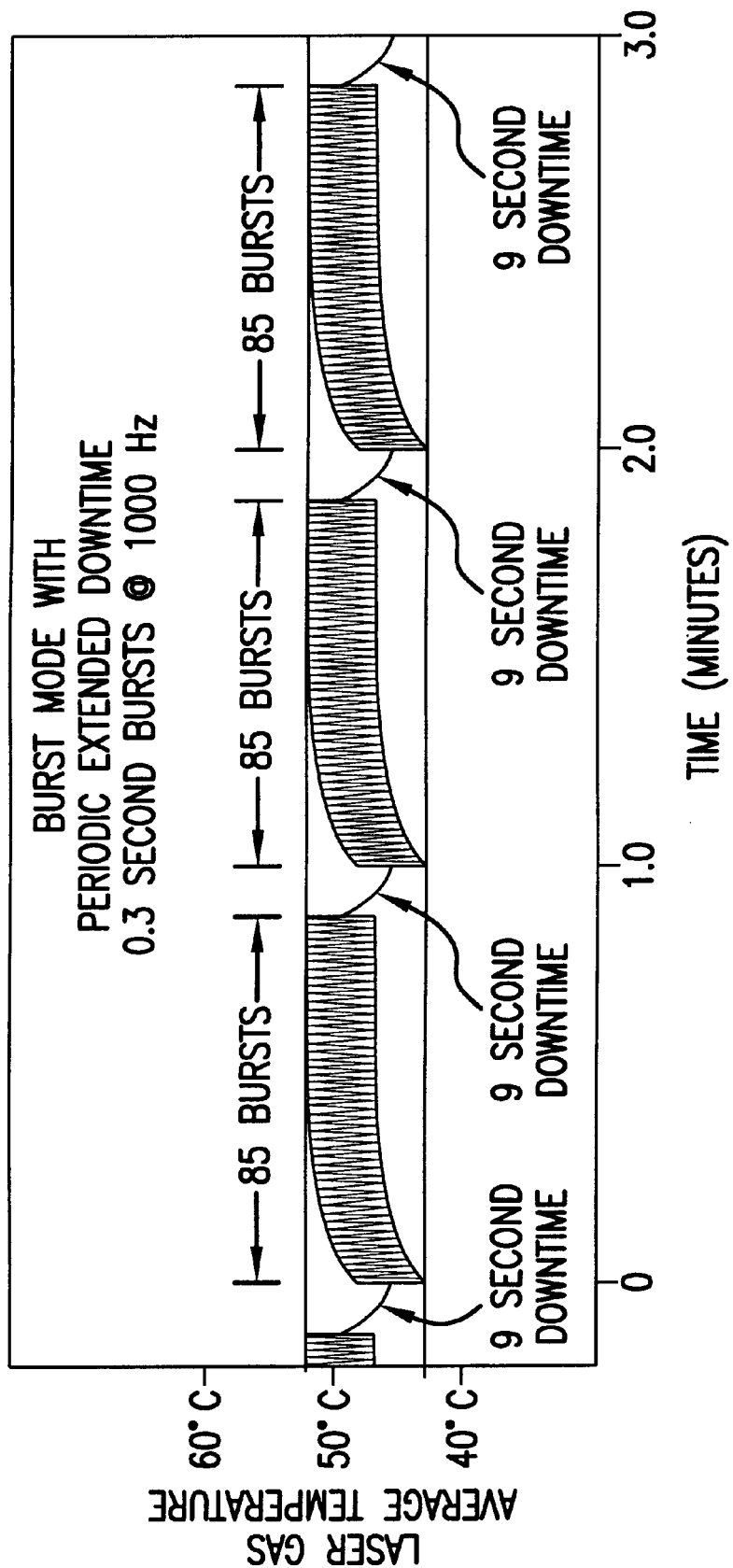
FIG. 6 shows average laser gas temperature swings on a few seconds time scale with burst mode and periodic 9-second down times.

On sheet 4 of 23, Fig. 5, change the second and lower occurrence of "DOWNSTREAM" to --UPSTREAM--.

UNITED STATES PATENT AND TRADEMARK OFFICE
CERTIFICATE OF CORRECTION

PATENT NO. : 6,034,978
DATED : March 7, 2000
INVENTOR(S) : Ujazdowski et al.

Page 2 of 2

It is certified that error appears in the above-identified patent and that said Letters Patent is hereby corrected as shown below:

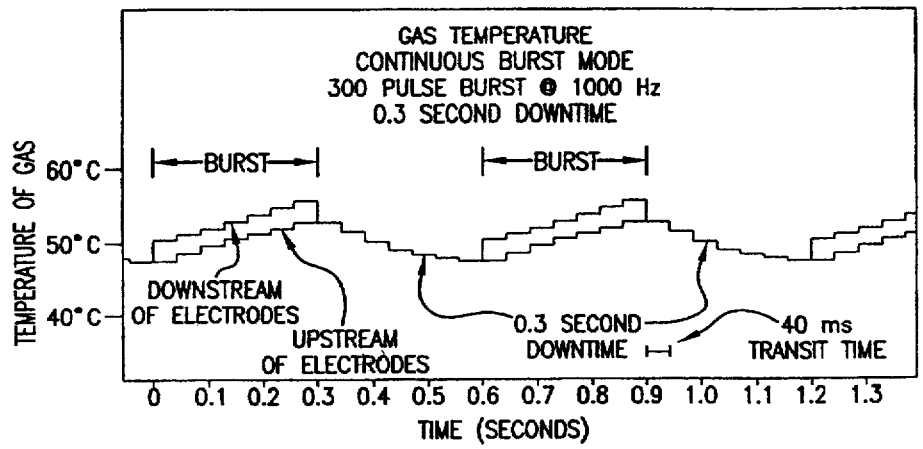

FIG.5

Signed and Sealed this

Seventh Day of August, 2001

*Attest:*

*Attesting Officer*

NICHOLAS P. GODICI
*Acting Director of the United States Patent and Trademark Office*